(12) United States Patent
Nayve et al.

(10) Patent No.: US 8,585,186 B2
(45) Date of Patent: Nov. 19, 2013

(54) METHOD OF MANUFACTURING SUBSTRATE AND SUBSTRATE, METHOD OF MANUFACTURING LIQUID DROP EJECTING HEAD AND LIQUID DROP EJECTING HEAD, AND LIQUID DROP EJECTING DEVICE

(75) Inventors: Regan Nayve, Kanagawa (JP); Michiaki Murata, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 13/443,980

(22) Filed: Apr. 11, 2012

(65) Prior Publication Data

US 2012/0194617 A1    Aug. 2, 2012

Related U.S. Application Data

(62) Division of application No. 11/704,668, filed on Feb. 9, 2007, now Pat. No. 8,177,334.

(30) Foreign Application Priority Data

Aug. 15, 2006   (JP) .................................. 2006-221549

(51) Int. Cl.
*B41J 2/045*   (2006.01)

(52) U.S. Cl.
USPC ........................................................... 347/68

(58) Field of Classification Search
USPC ...................................... 347/68–72; 29/25.35
See application file for complete search history.

(56) References Cited

U.S. PATENT DOCUMENTS 7,153,758 B2   12/2006   Hata et al.

FOREIGN PATENT DOCUMENTS

JP   11-233909   8/1999
JP   11-320873   11/1999

*Primary Examiner* — Kristal Feggins
(74) *Attorney, Agent, or Firm* — Fildes & Outland, P.C.

(57) ABSTRACT

The present invention provides a method of manufacturing a substrate which forms a wiring pattern on a substrate having a plurality of through-holes. In the method, the wiring pattern is formed, after burying a filling material into the through-holes and planarizing a surface of the substrate. The filling material may be a conductive material, and a portion of the conductive material may be removed after the wiring pattern is formed. Removal of the portion of the conductive material may be carried out after a protective film, which protects the wiring pattern, is formed. The filling material may be a conductive material and a sacrificial material, and the sacrificial material may be removed after the wiring pattern is formed.

2 Claims, 36 Drawing Sheets

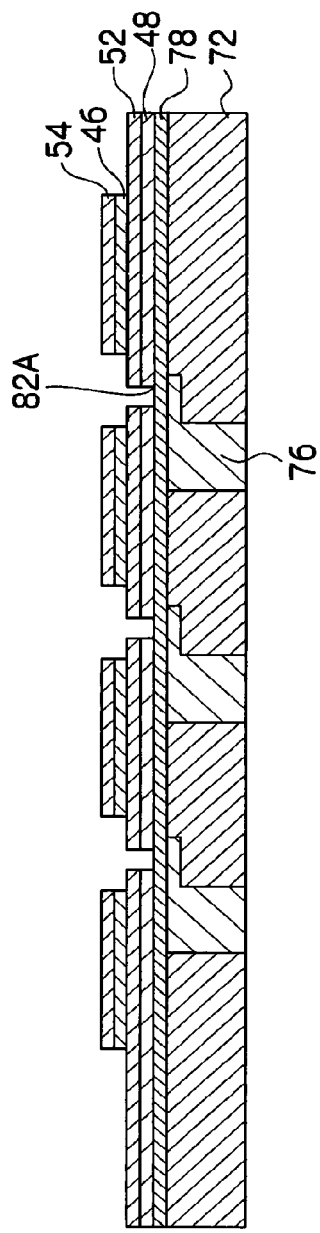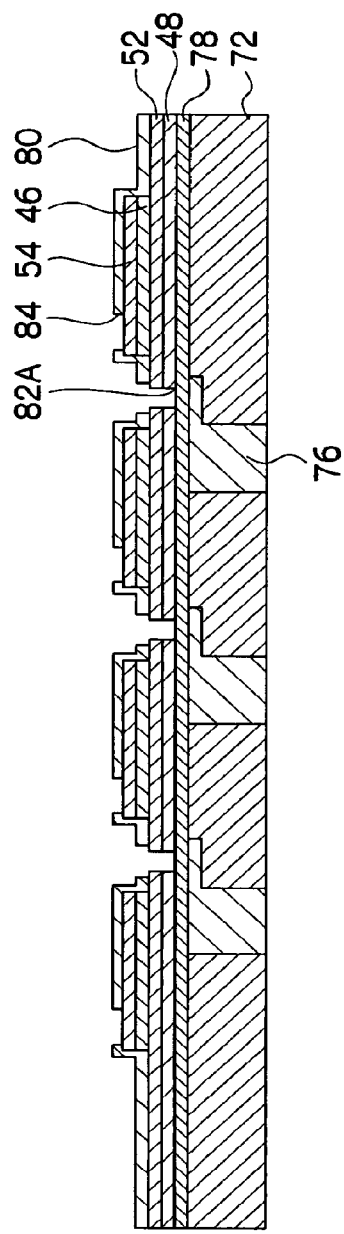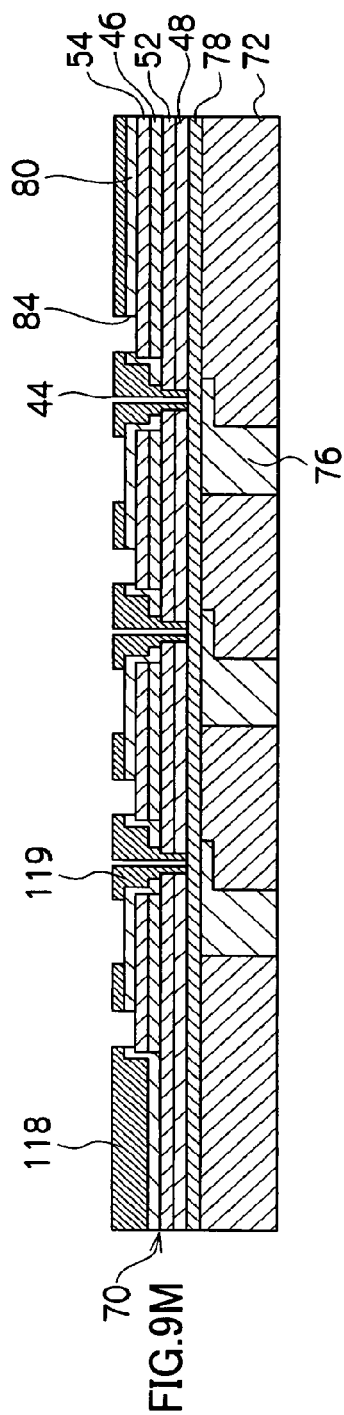

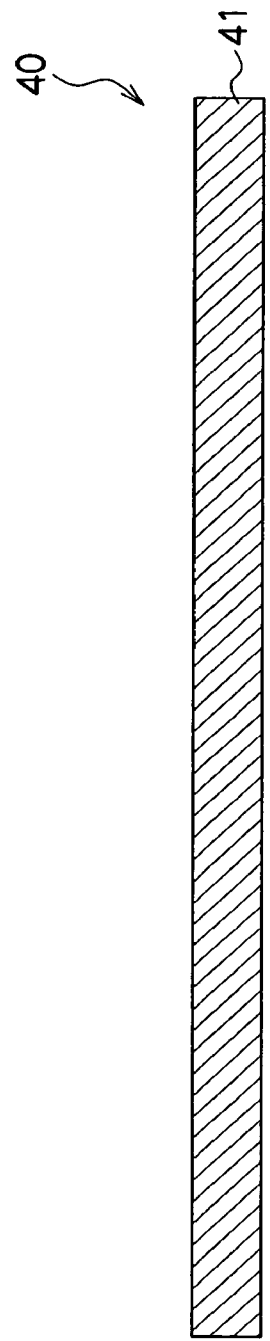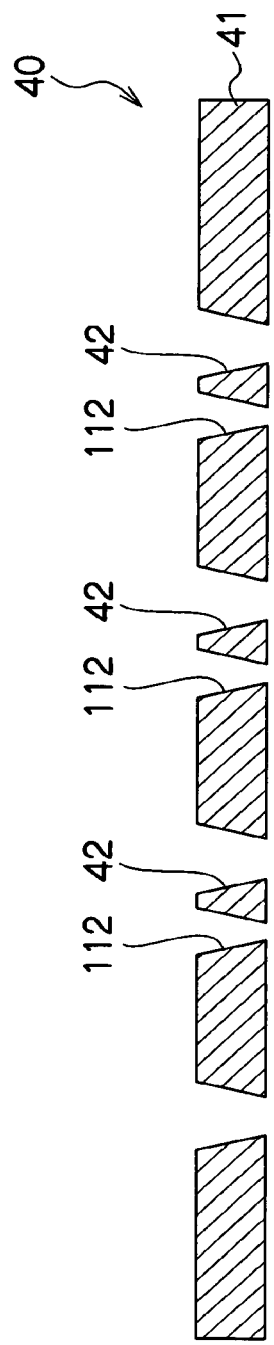
FIG.10A
FIG.10B

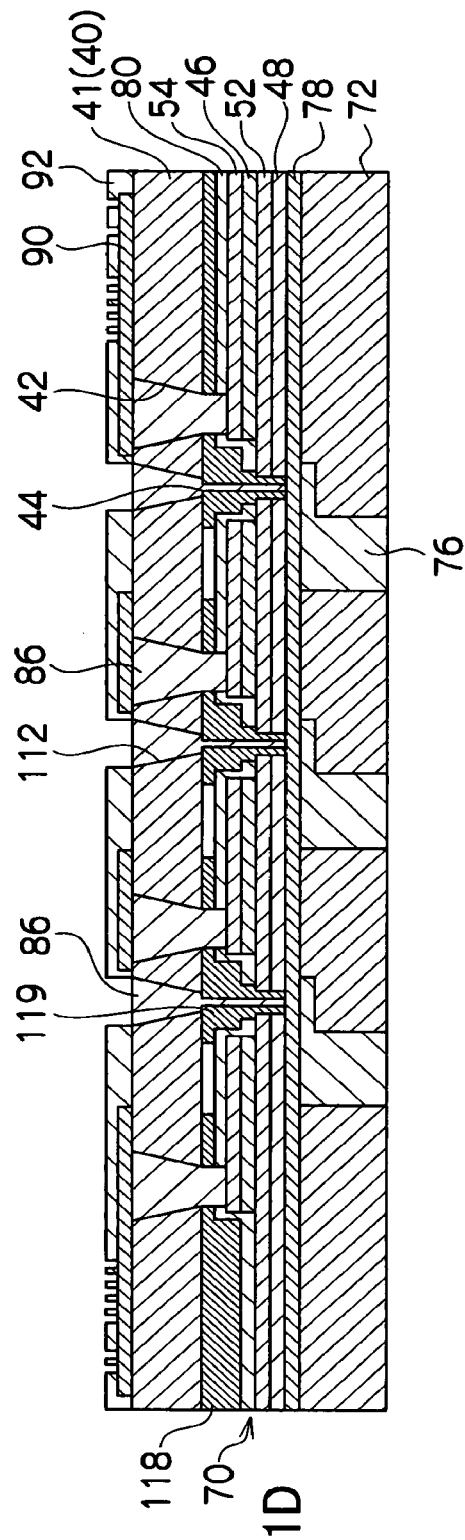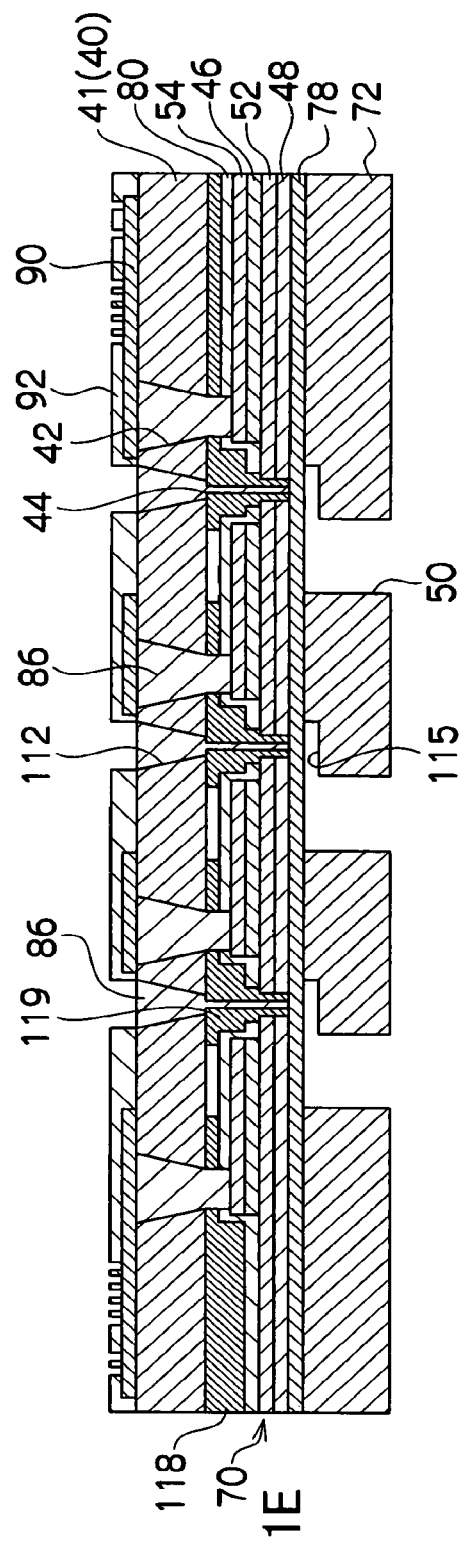

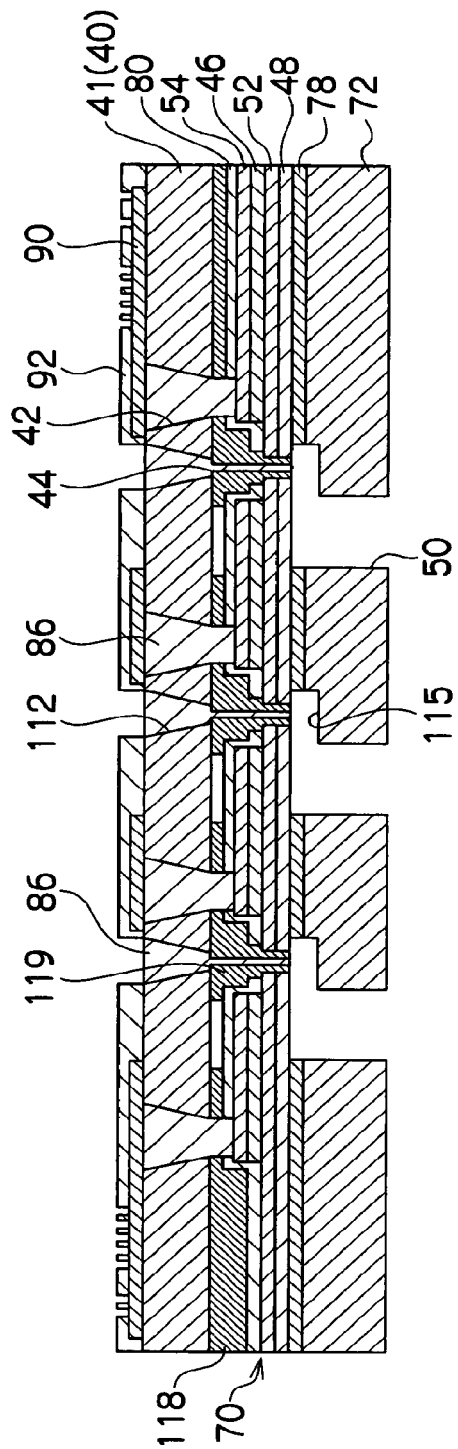
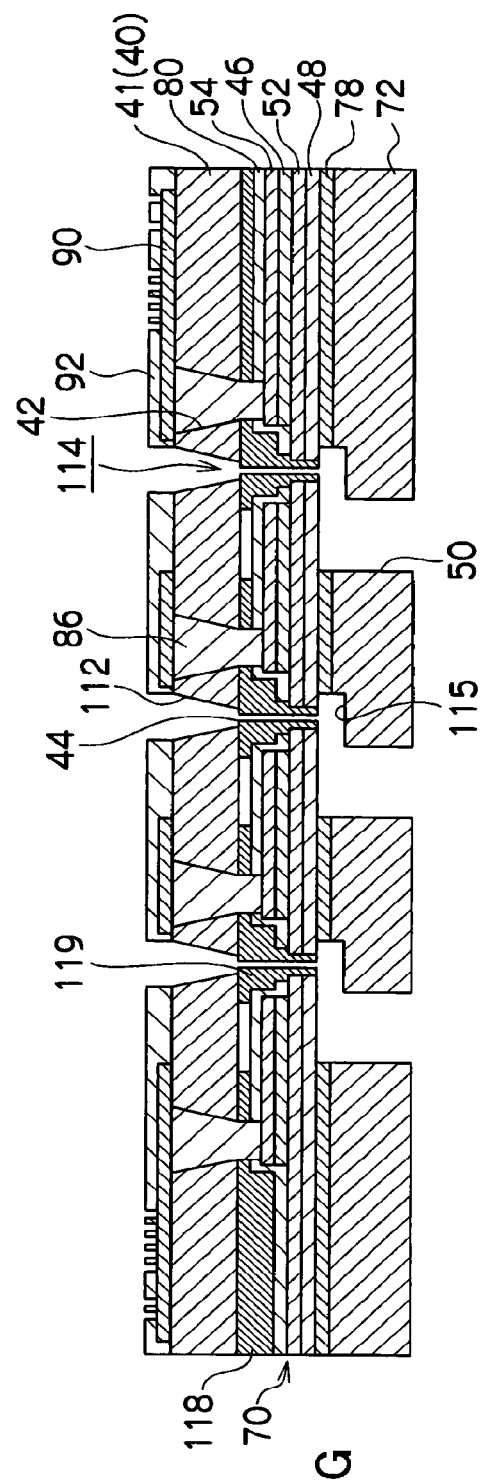
FIG.11F
FIG.11G

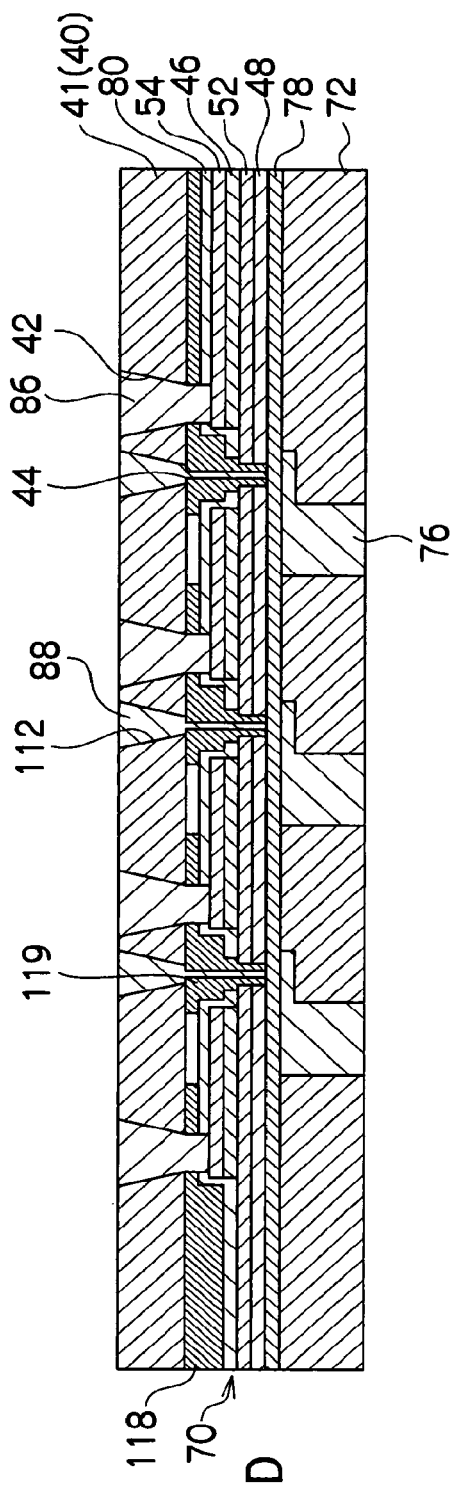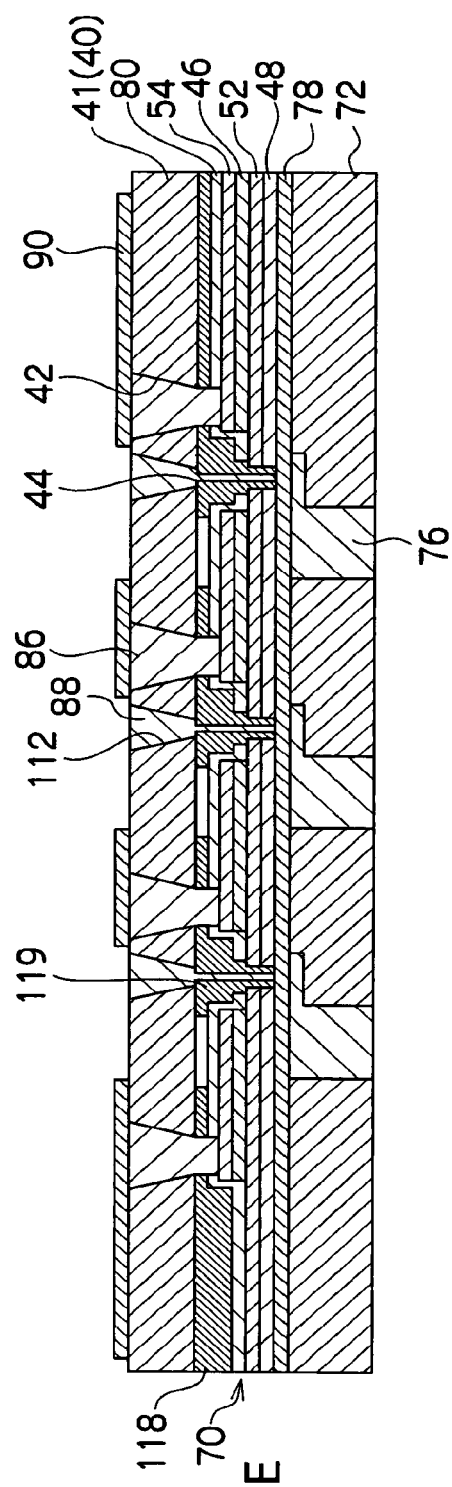

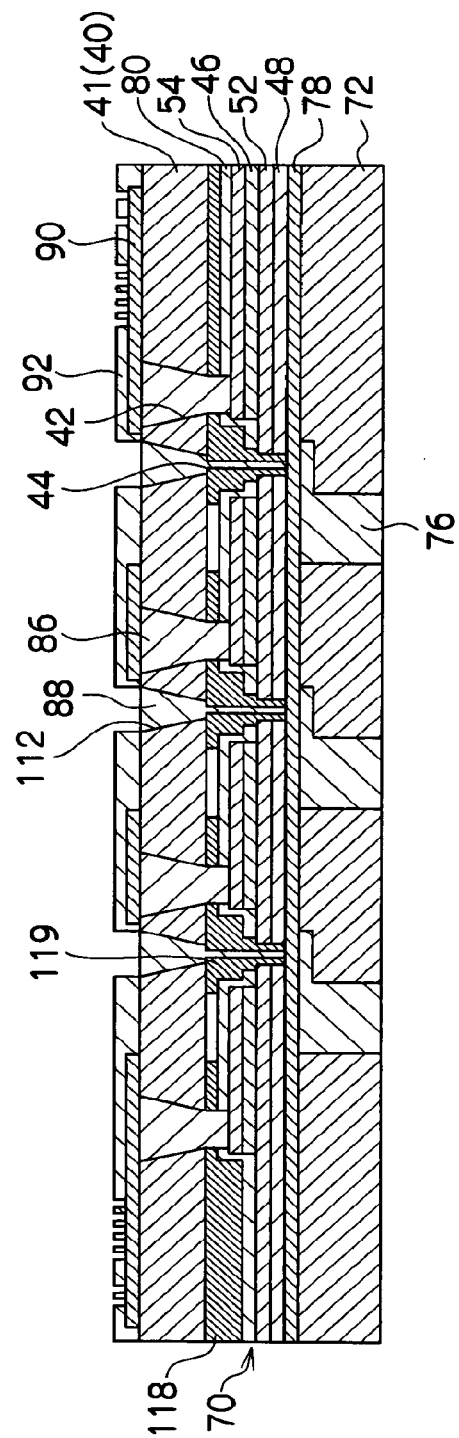
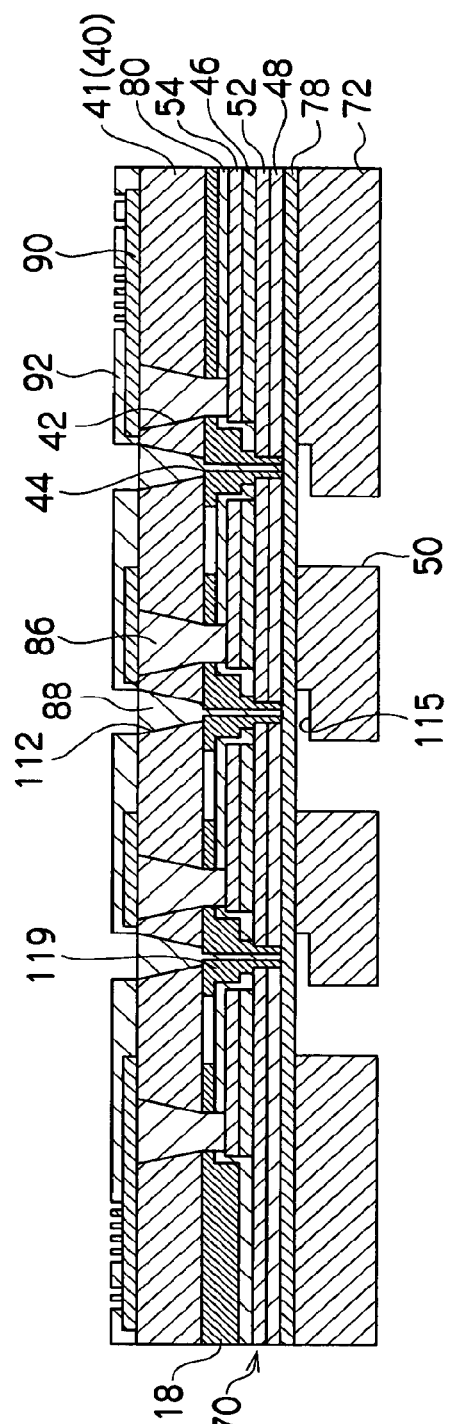
FIG.13F
FIG.13G

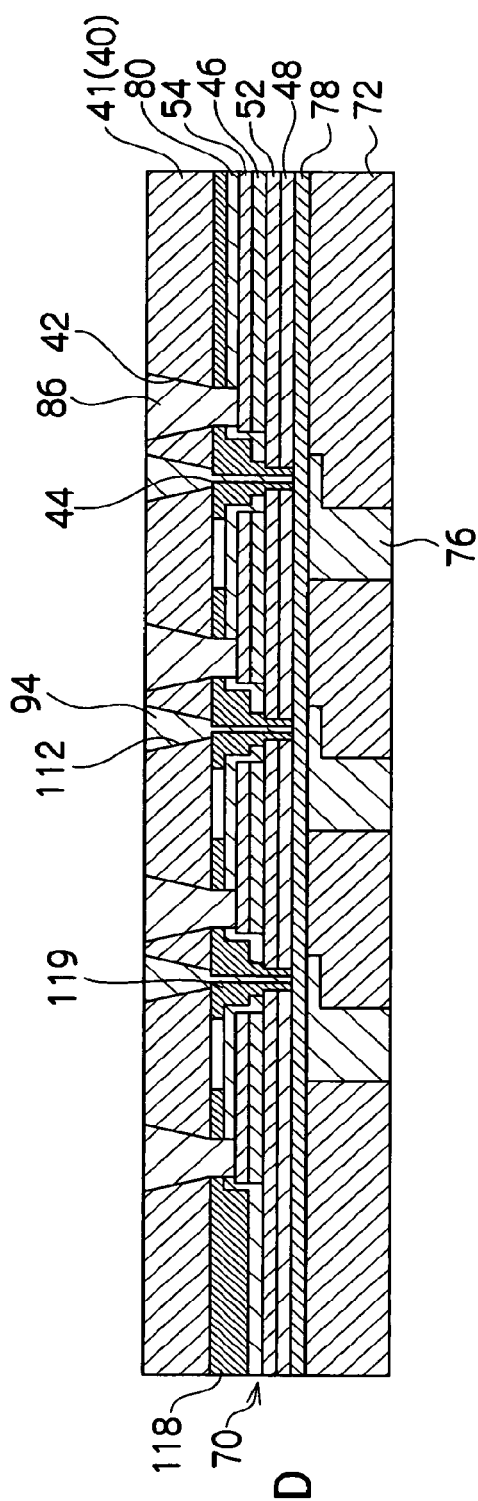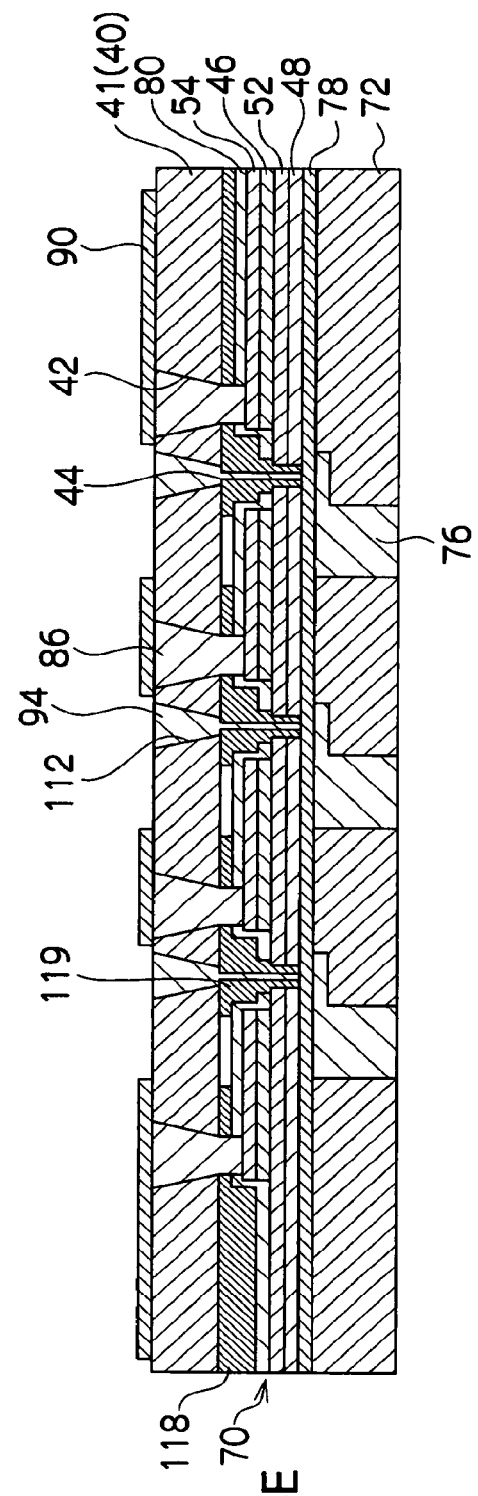

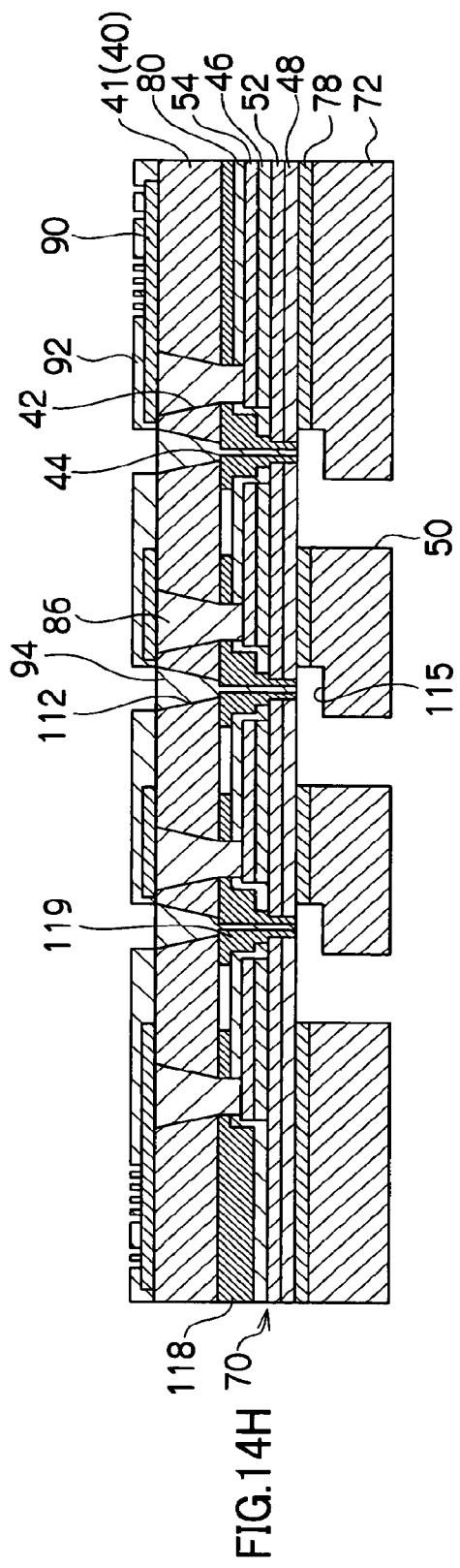
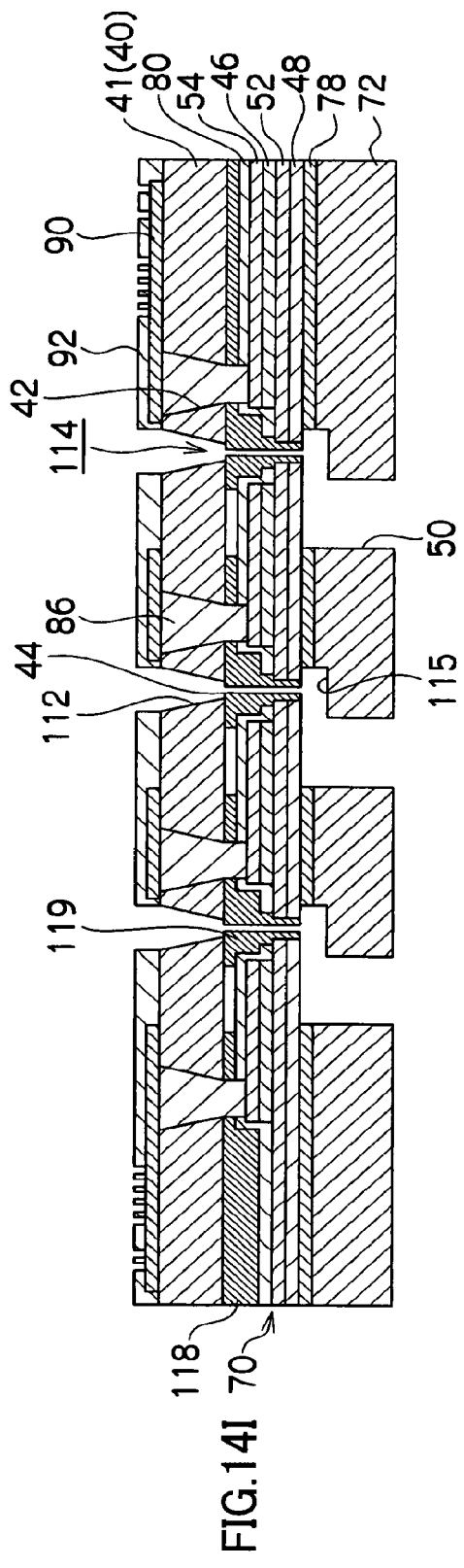

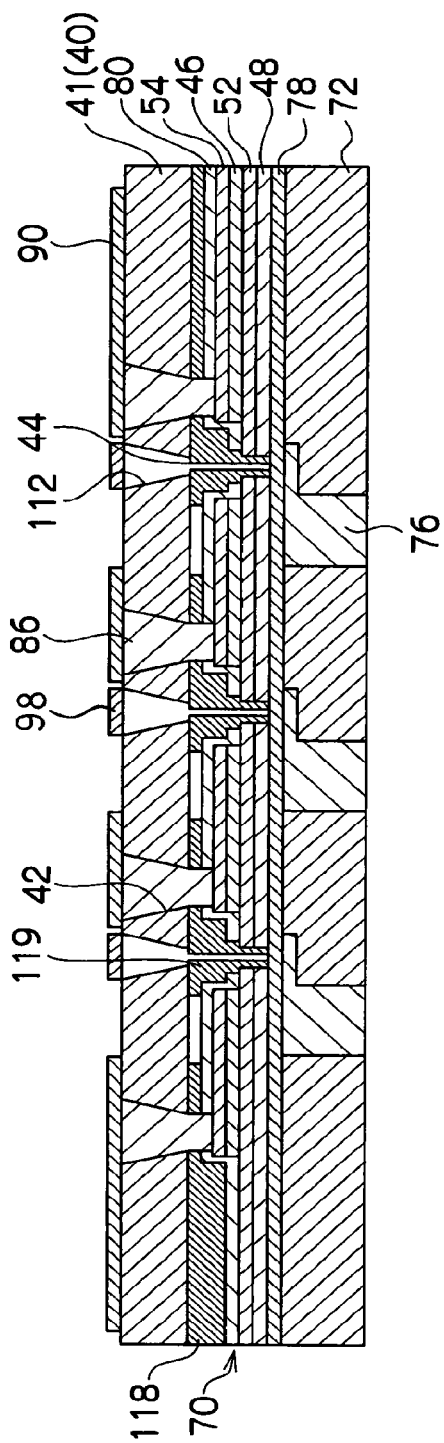
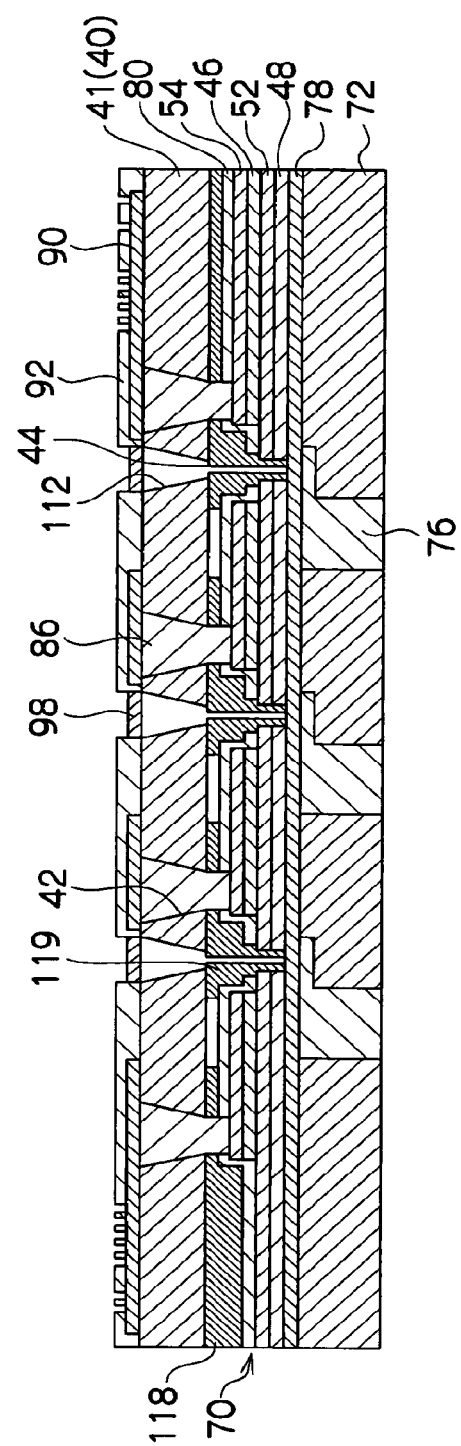
FIG.16D
FIG.16E

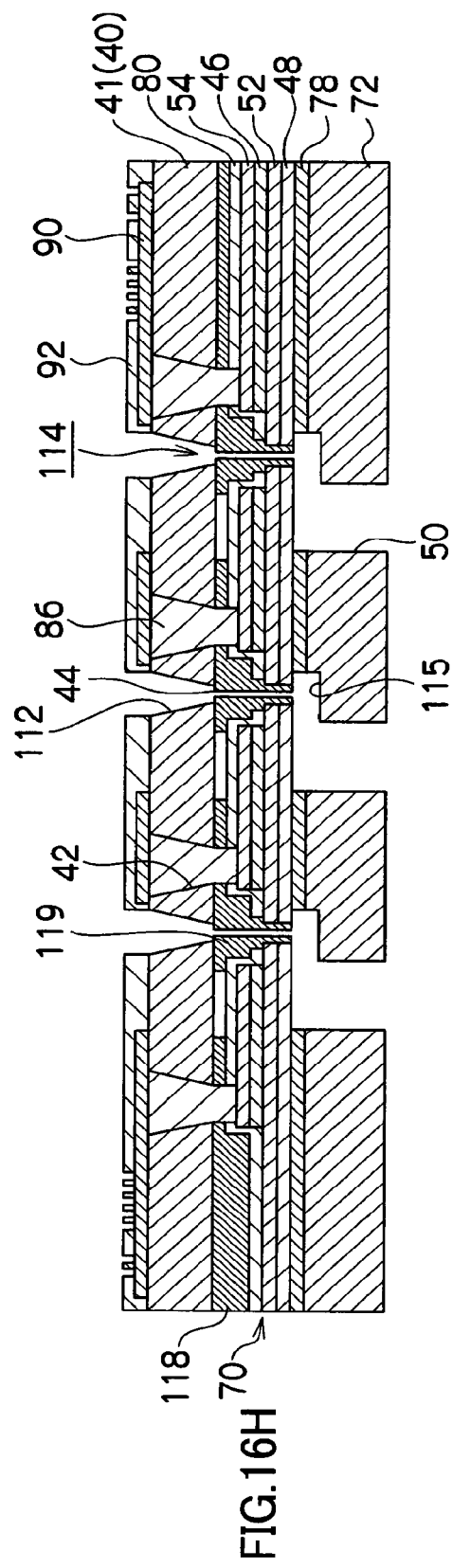

METHOD OF MANUFACTURING SUBSTRATE AND SUBSTRATE, METHOD OF MANUFACTURING LIQUID DROP EJECTING HEAD AND LIQUID DROP EJECTING HEAD, AND LIQUID DROP EJECTING DEVICE

CROSS-REFERENCE TO RELATED APPLICATIONS

This application is a division of U.S. application Ser. No. 11/704,668 filed Feb. 9, 2007, now U.S. Pat. No. 8,177,334, which is based on and claims priority under 35 USC 119 from Japanese Patent Application No. 2006-221549 filed Aug. 15, 2006.

BACKGROUND

1. Technical Field

The present invention relates to a method of manufacturing a substrate which forms a wiring pattern on a substrate having a plurality of through-holes, and to a substrate manufactured thereby, and further relates to a method of manufacturing a liquid drop ejecting head and a liquid drop ejecting head, as well as a liquid drop ejecting device, in accordance therewith.

2. Related Art

There have conventionally been known inkjet recording devices (liquid drop ejecting devices) which selectively eject ink drops from plural nozzles of an inkjet recording head (a liquid drop recording head), and print an image (including characters) or the like onto a recording medium such as a recording sheet or the like. A plurality of through-holes for electrical connection and through-holes for ink supply (ink supply paths) and the like are formed in a substrate which structures a piezo-type inkjet recording head.

Forming a high-density wiring pattern, a protective film which protects the wiring pattern, and the like on the substrate therefore is relatively difficult. Namely, in a case in which, for example, a protective film for the wiring is formed (film-formed) on the substrate, there are problems such as the in-plane uniformity of the film thickness at the through-hole portions deteriorates, and it is difficult to control film formation around the through-holes (at the edges thereof) (i.e., the profile becomes unstable). Further, with regard to forming (film-forming) the protective film and the like, when it is difficult to make the film thick, there is also the problem that the produceability deteriorates.

SUMMARY

According to an aspect of the invention, there is provided a method of manufacturing a substrate which forms a wiring pattern on a substrate having a plurality of through-holes. The method includes: forming the wiring pattern, after burying a filling material into the through-holes and planarizing a surface of the substrate.

BRIEF DESCRIPTION OF THE DRAWINGS

Exemplary embodiments of the present invention will be described in detail based on the following figures, wherein:

FIG. 9A to FIG. 9M are explanatory drawings showing process relating to a first exemplary embodiment of the present invention which manufactures a piezoelectric element substrate on a silicon substrate;

FIG. 10A and FIG. 10B are explanatory drawings showing process of manufacturing a ceiling plate member;

FIG. 11A to FIG. 11G are explanatory drawings showing process relating to the first exemplary embodiment of the present invention, after joining the ceiling plate member to the piezoelectric element substrate;

FIG. 13A to FIG. 13I are explanatory drawings showing process relating to a second exemplary embodiment of the present invention, after joining the ceiling plate member to the piezoelectric element substrate;

FIG. 14A to FIG. 14I are explanatory drawings showing process relating to a third exemplary embodiment of the present invention, after joining the ceiling plate member to the piezoelectric element substrate;

FIG. 16A to FIG. 16H are explanatory drawings showing process relating to a fifth exemplary embodiment of the present invention, after joining the ceiling plate member to the piezoelectric element substrate.

DETAILED DESCRIPTION

Figure 1:
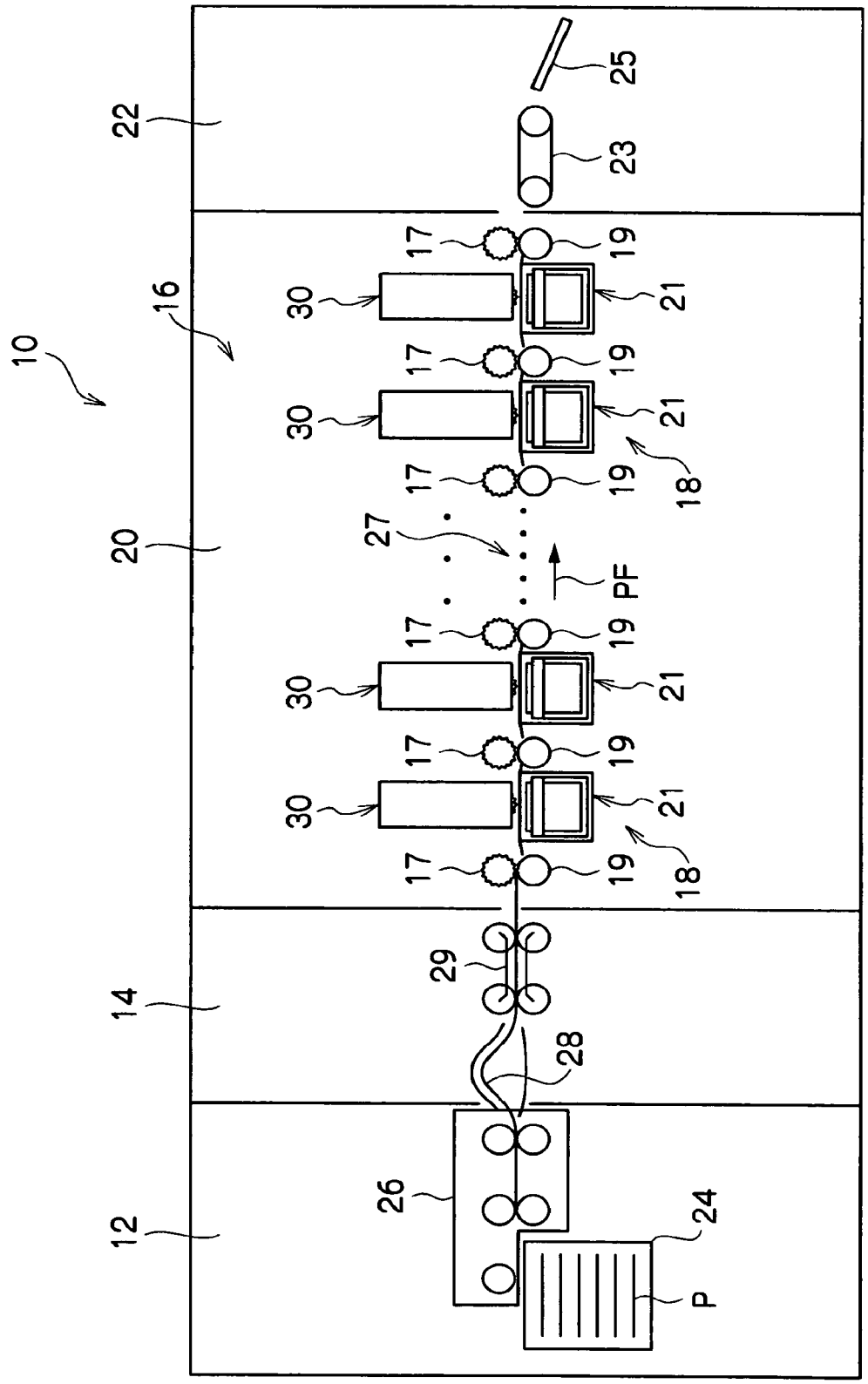
FIG. 1 is schematic front view showing an inkjet recording device.

Hereinafter, exemplary embodiments of the present invention will be described in detail on the basis of the examples illustrated in the drawings. Note that description will be given by using an inkjet recording device 10 as an example of a liquid drop ejecting device. Accordingly, description is given with the liquid being an ink 110, and the liquid drop ejecting head being an inkjet recording head 32. Description is given with the recording medium being a recording sheet P. Further, in accordance therewith, the "substrate" relating to the present invention means a piezoelectric element substrate 70 (including a ceiling plate member 40) structuring the inkjet recording head 32 in the first through fifth exemplary embodiments, and description of a circuit substrate 101 other than the piezoelectric element substrate 70 is given in the sixth exemplary embodiment.

First Exemplary Embodiment

As shown in FIG. 1, the inkjet recording device 10 is basically structured from a sheet supplying section 12 which feeds-out the recording sheet P; a registration adjusting section 14 controlling the posture of the recording sheet P; a recording section 20 having a recording head portion 16 which ejects ink drops and forms an image on the recording sheet P, and a maintenance portion 18 which carries out maintenance of the recording head portion 16; and a discharging section 22 discharging the recording sheet P on which an image has been formed at the recording section 20.

The sheet supplying section 12 is structured from a stocker 24 in which the recording sheets P are layered and stocked, and a conveying device 26 which removes the recording sheet P one-by-one from the stocker 24 and conveys it to the registration adjusting section 14. The registration adjusting section 14 has a loop forming portion 28 and a guide member 29 which controls the posture of the recording sheet P. Due to the recording sheet P passing through this section, the skew is corrected by utilizing the stiffness of the recording sheet P, and the conveying timing is controlled, and the recording sheet P is supplied to the recording section 20. Further, via a sheet discharging belt 23, the discharging section 22 accommodates the recording sheet P, on which an image has been formed at the recording section 20, at a tray 25.

A sheet conveying path 27 along which the recording sheet P is conveyed is structured between the recording head portion 16 and the maintenance portion 18 (the sheet conveying direction is shown by arrow PF). The sheet conveying path 27 has star wheels 17 and conveying rollers 19, and continuously (without stoppage) conveys the recording sheet P while nipping the recording sheet P between the star wheels 17 and the conveying rollers 19. Then, ink drops are expelled from the recording head portion 16 onto the recording sheet P, and an image is formed on the recording sheet P.

The maintenance portion 18 has maintenance devices 21 which are disposed so as to oppose inkjet recording units 30, and carries out processings such as capping, wiping, dummy jetting, vacuuming, and the like on the inkjet recording heads 32.

Figure 2:
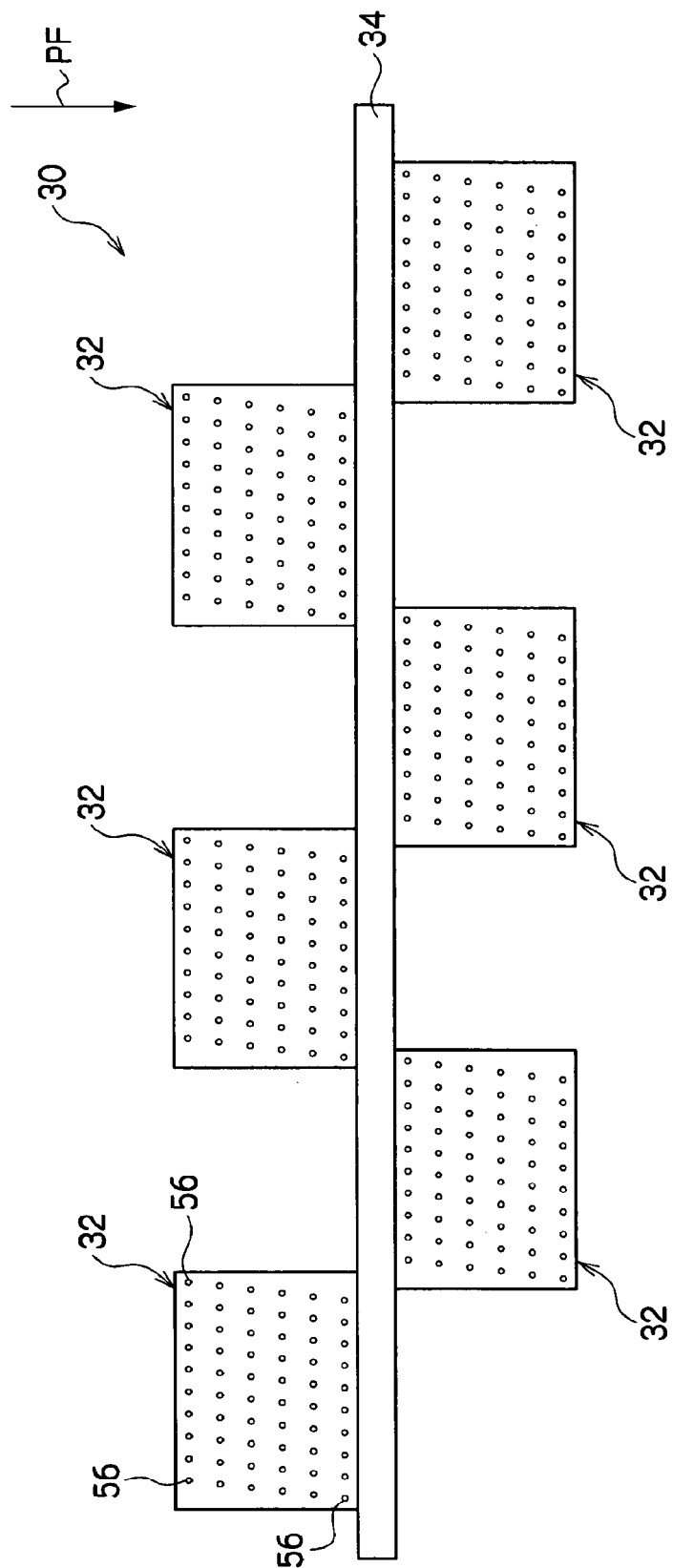
FIG. 2 is an explanatory drawing showing an array of inkjet recording heads.

As shown in FIG. 2, each inkjet recording unit 30 has a supporting member 34 which is disposed in a direction orthogonal to the sheet conveying direction shown by arrow PF. A plurality of the inkjet recording heads 32 are mounted to the supporting member 34. A plurality of nozzles 56 are formed in the form of a matrix at the inkjet recording head 32, such that the nozzles 56 are lined-up at a uniform pitch in the transverse direction of the recording sheet P as the overall inkjet recording unit 30.

An image is recorded on the recording sheet P by ink drops being ejected from the nozzles 56 onto the recording sheet P which is conveyed continuously along the sheet conveying path 27. Note that at least four of the inkjet recording units 30 are disposed in correspondence with the respective colors of yellow (Y), magenta (M), cyan (C), and black (K) in order to record a so-called full-color image for example.

Figure 3:
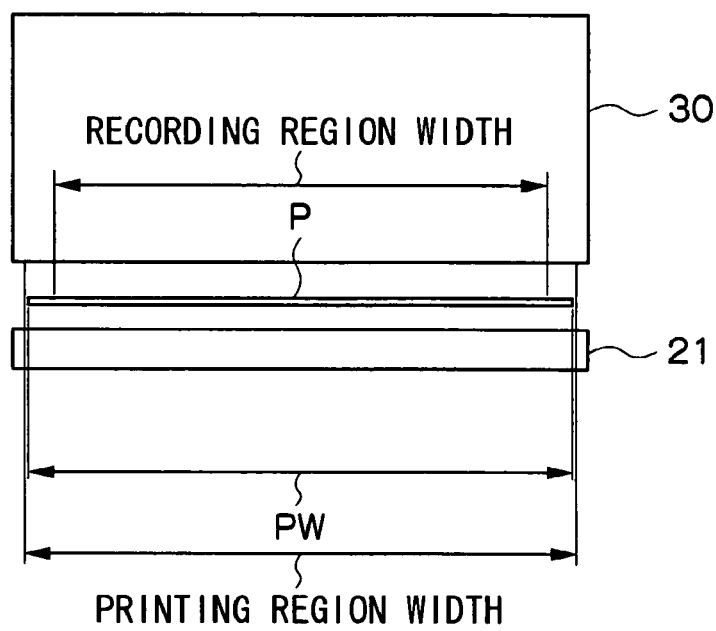
FIG. 3 is an explanatory drawing showing the relationship between the width of a recording medium and the width of a printing region.

As shown in FIG. 3, the width of the printing region by the nozzles 56 of each inkjet recording unit 30 is longer than a maximum sheet width PW of the recording sheet P for which image recording at the inkjet recording device 10 is supposed, such that image recording over the entire width of the recording sheet P is possible without moving the inkjet recording unit 30 in the transverse direction of the sheet. Namely, the inkjet recording unit 30 is a full width array (FWA) which enables single pass printing.

Here, the basic printing region width is the maximum width among recording regions from which margins, at which printing is not carried out, are subtracted from the both ends of the recording sheet P, and generally, is larger than the maximum sheet width PW which is the object of printing. This is because there is the concern that the recording sheet P will be conveyed while inclined at a predetermined angle with respect to the conveying direction (i.e., while skewed), and because the demand for borderless printing is high.

Figure 4A:
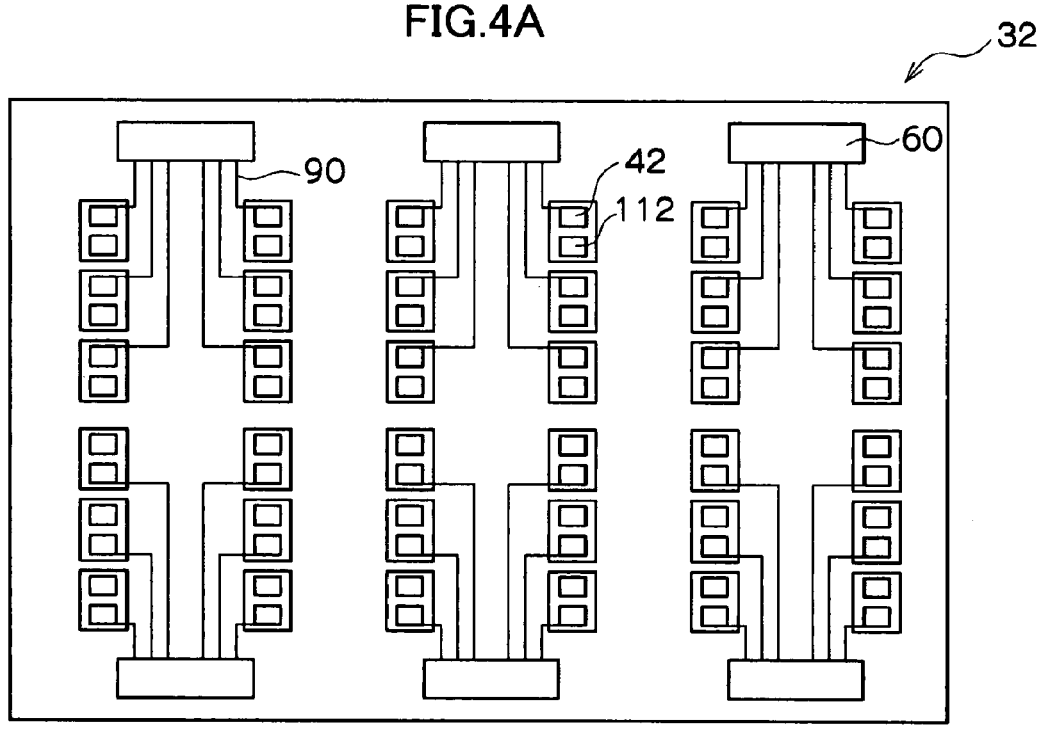
FIG. 4A is a schematic plan view showing the overall structure of the inkjet recording head.
Figure 4B:
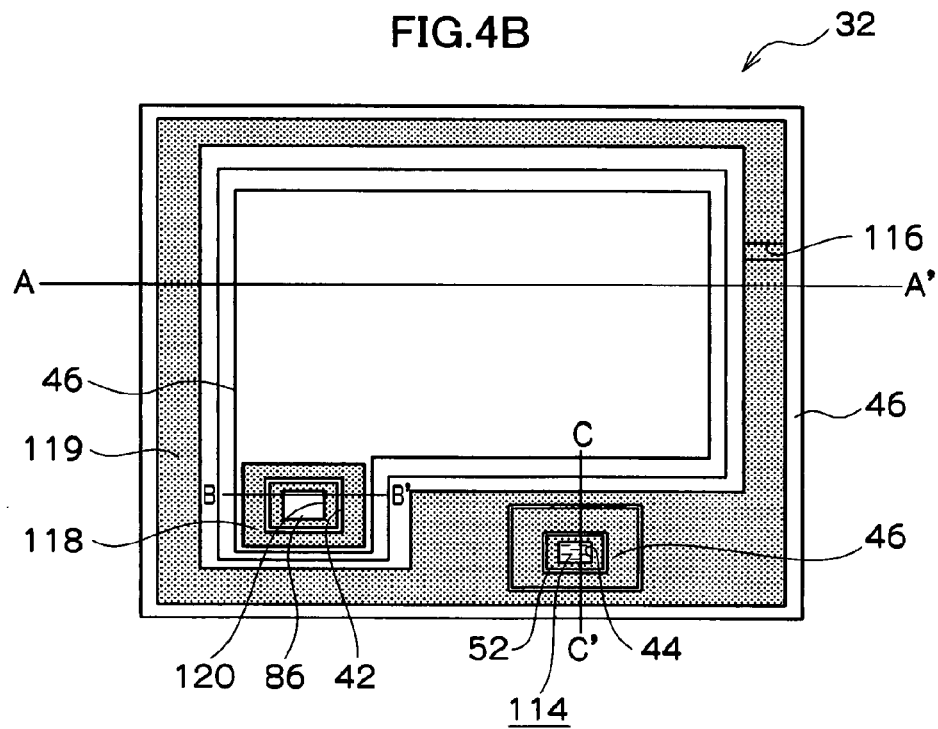
FIG. 4B is a schematic plan view showing the structure of one element of the inkjet recording head.

Next, the inkjet recording head 32 in the inkjet recording device 10 of the above-described structure will be described in detail. FIGS. 4A and 4B are schematic plan views showing the structure of the inkjet recording head 32 of the first exemplary embodiment. Namely, FIG. 4A illustrates the overall structure of the inkjet recording head 32, and FIG. 4B illustrates the structure of one element.

Figure 5A:
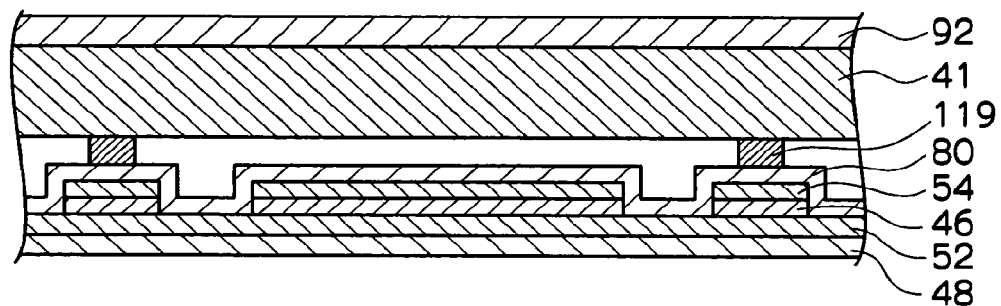
FIG. 5A is a A-A' sectional view in FIG. 4B.
Figure 5B:
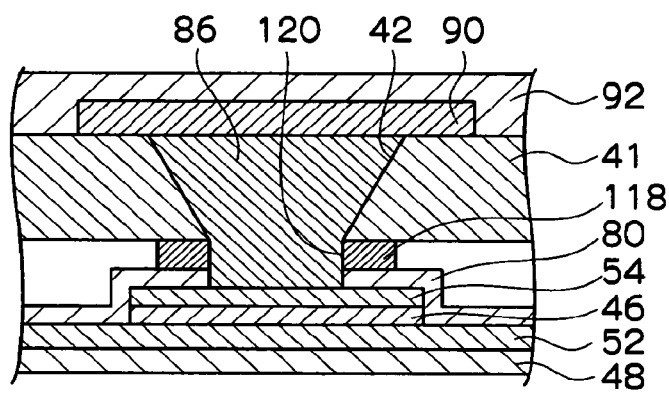
FIG. 5B is a B-B' sectional view in FIG. 4B.
Figure 5C:
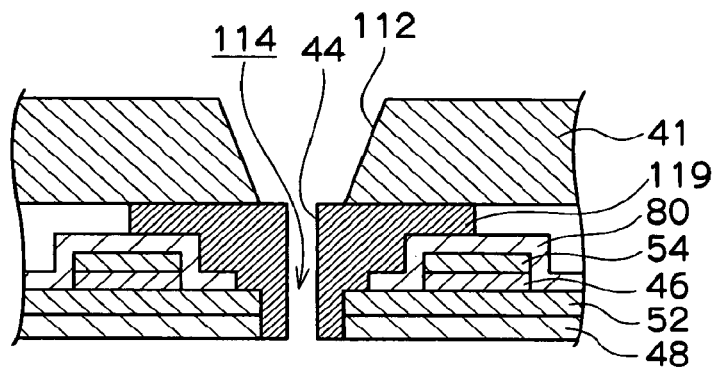
FIG. 5C is a C-C' sectional view in FIG. 4B.
Figure 6:
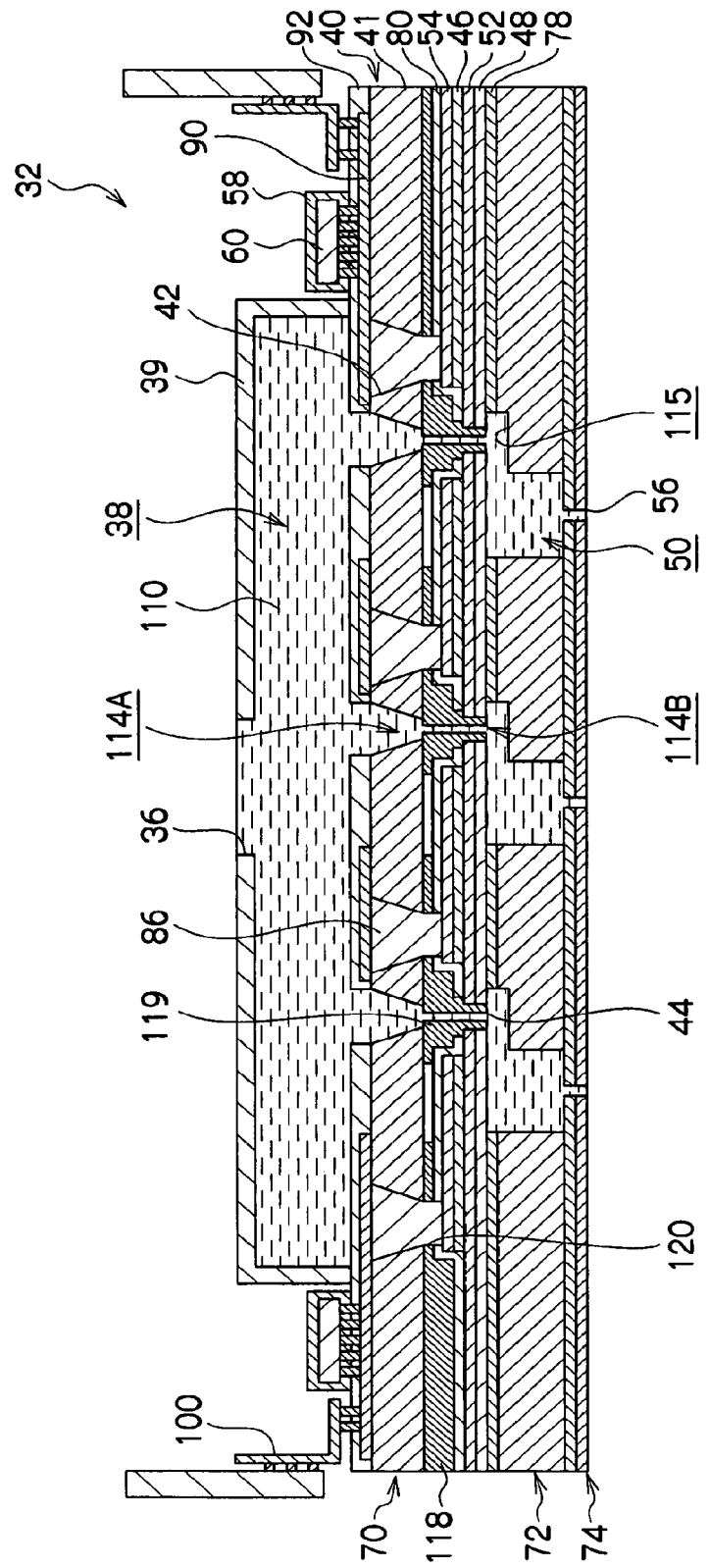
FIG. 6 is a schematic sectional view showing the structure of the inkjet recording head.

FIGS. 5A through 5C show respective portions of FIG. 4B in cross-sections along line A-A', line B-B', and line C-C' respectively. However, a silicon substrate 72, a pool chamber member 39, and the like which will be described later are omitted. Further, FIG. 6 is a schematic longitudinal sectional view from which portions of the inkjet recording head 32 are removed so that the main portions are clear.

The ceiling plate member 40 is disposed at the inkjet recording head 32. In the present exemplary embodiment, a ceiling plate 41, which is formed of glass and structures the ceiling plate member 40, is plate-shaped and has wires, and is the ceiling plate of the entire inkjet recording head 32. Namely, driving ICs 60 and metal wires 90 for energizing the driving ICs 60 are provided at the ceiling plate member 40. The metal wires 90 are covered and protected by resin protective films 92, such that corrosion thereof due to the ink 110 is prevented.

Figure 7:
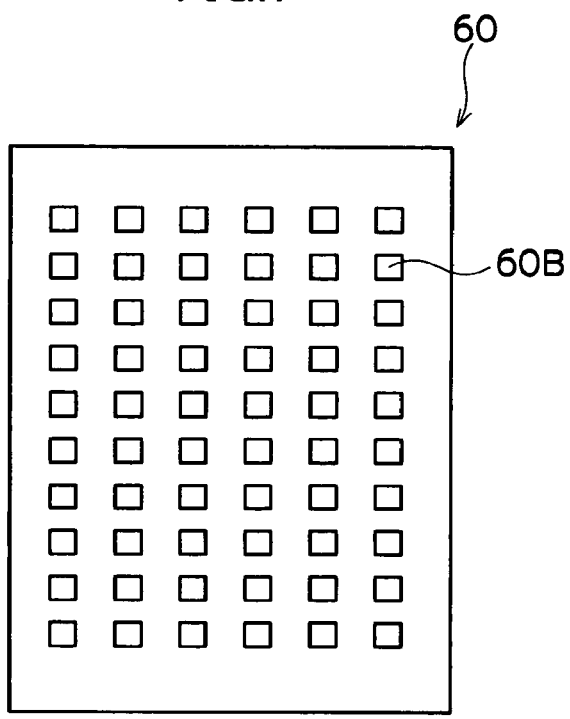
FIG. 7 is a schematic plan view showing bumps of a driving IC of the inkjet recording head.

Further, as shown in FIG. 7, plural bumps 60B are provided in the form of a matrix so as to project to a predetermined height at the bottom surface of the driving IC 60, and are flip-chip packaged to the metal wire 90 on the ceiling plate 41 at the outer side of the pool chamber member 39. Accordingly, it is easy to realize high-density wiring and low resistance with respect to piezoelectric elements 46, and compactness of the inkjet recording head 32 can thereby be realized. Note that the periphery of the driving IC 60 is sealed by a resin material 58.

The pool chamber member 39, which is structured of an ink-resistant material, is affixed to the ceiling plate member 40. An ink pool chamber 38, which has a predetermined shape and volume, is formed between the pool chamber member 39 and the ceiling plate 41. An ink supply port 36, which communicates with an ink tank (not shown), is formed at a predetermined place at the pool chamber member 39. The ink 110 which is injected-in from the ink supply port 36 is stored in the ink pool chamber 38.

Through-holes 112 for ink supply, which correspond one-to-one to pressure chambers 115 which will be described later, are formed in the ceiling plate 41, and the interiors thereof form first ink supply paths 114A. Further, through-holes 42 for electrical connection are formed in the ceiling plate 41 at positions corresponding to upper electrodes 54 which will be described later. By filling a paste-like conductive material (hereinafter called "conductive paste") 86 which will be described later into the through-holes 42 for electrical connection, the metal wires 90 and the upper electrodes 54 are electrically connected, and individual wires of the piezoelectric element substrate 70 which will be described later are not needed.

The pressure chambers 115, in which are filled the ink 110 supplied from the ink pool chamber 38, are formed in the silicon substrate 72 which serves as a flow path substrate. Ink drops are ejected from the nozzles 56 which communicate with the pressure chambers 115. Further, the ink pool chamber 38 and the pressure chambers 115 are structured so as to not exist on the same horizontal plane. Accordingly, the pressure chambers 115 can be disposed in a state of being close to one another, and the nozzles 56 can be disposed highly-densely in the form of a matrix.

A nozzle plate 74 in which the nozzles 56 are formed is affixed to the bottom surface of the silicon substrate 72. The piezoelectric element substrate 70 is formed (fabricated) on the top surface of the silicon substrate 72. The piezoelectric element substrate 70 has vibrating plates 48. By generating a pressure wave by increasing and decreasing the volume of the pressure chamber 115 due to vibration of the vibrating plate 48, ink drops can be ejected from the nozzle 56. Accordingly, the vibrating plate 48 structures one surface of the pressure chamber 115.

The piezoelectric element 46 is adhered to the top surface of the vibrating plate 48 at each pressure chamber 115. The vibrating plate 48 is an SiOx film formed by Chemical Vapor Deposition (CVD), and has elasticity at least in the vertical direction. When the piezoelectric element 46 is energized (i.e., when voltage is applied thereto), the vibrating plate 48 flexurally deforms (displaces) in the vertical direction. Note that the vibrating plate 48 may be a metal material such as Cr or the like.

A lower electrode 52 which is one polarity is disposed at the bottom surface of the piezoelectric element 46, and the upper electrode 54 which is the other polarity is disposed at the top surface of the piezoelectric element 46. Further, the piezoelectric elements 46 are covered and protected by low water permeable insulating films (SiOx films) 80. The low water permeable insulating films (SiOx films) 80, which cover and protect the piezoelectric elements 46, are deposited under the condition that the moisture permeability is low. Therefore, the low water permeable insulating films 80 can prevent poor reliability due to moisture penetrating into the piezoelectric elements 46 (a deterioration in the piezoelectric characteristic caused by the oxygen within the PZT film reducing).

A partitioning resin layer 119 is layered on the low water permeable insulating film (SiOx film) 80. As shown in FIG. 4B, the partitioning resin layer 119 demarcates the space between the piezoelectric element substrate 70 and the ceiling plate member 40. Through-holes 44 for ink supply, which communicate with the through-holes 112 for ink supply of the ceiling plate 41, are formed in the partitioning resin layer 119, and the interiors thereof are second ink supply paths 114B.

The second ink supply path 114B has a cross-sectional area which is smaller than the cross-sectional area of the first ink supply path 114A, such that the flow path resistance of an entire ink supply path 114 is adjusted to become a predetermined value. Namely, the cross-sectional area of the first ink supply path 114A is made to be sufficiently larger than the cross-sectional area of the second ink supply path 114B, and is of an extent that can substantially be ignored as compared with the flow path resistance at the second ink supply path 114B. Accordingly, the flow path resistance of the ink supply path 114 from the ink pool chamber 38 to the pressure chamber 115 is prescribed only at the second ink supply path 114B.

Further, by supplying the ink 110 by the through-hole 44 for ink supply which is formed in the partitioning resin layer 119 in this way, leakage of ink to the piezoelectric element 46 regions in the midst of supplying is prevented. Note that atmosphere communicating holes 116 are formed in the partitioning resin layer 119, and reduce fluctuations in the pressure of the spaces of the ceiling plate 41 and the piezoelectric element substrate 70 at the time of manufacturing the inkjet recording head 32 and at the time of image recording. Further, a partitioning resin layer 118 is layered also at positions corresponding to the through-holes 42 for electrical connection, and through-holes 120 are formed in the partitioning resin layer 118. FIG. 4B shows the cross-section at a position where the partitioning resin layer 118 and the partitioning resin layer 119 are separated, but they are partially connected in actuality.

Gaps are structured by the partitioning resin layers 118, 119 between the ceiling plate member 40 and the piezoelectric elements 46 (strictly speaking, the low water permeable insulating films (SiOx films) 80 on the piezoelectric elements 46), such that an air layer is formed. Owing to this air layer, the driving of the piezoelectric elements 46 and the vibrating of the vibrating plates 48 are not affected. Further, the partitioning resin layer 119 and the partitioning resin layer 118 are structured such that the heights of the top surfaces thereof are uniform, i.e., flush. Accordingly, the heights (distances) of the opposing surfaces of the partitioning resin layer 119 and the partitioning resin layer 118, measured from the ceiling plate 41, also are the same. In this way, the contacting ability at the time of being contacted by the ceiling plate 41 improves, and the sealing ability also improves.

The signal from the driving IC 60 is conducted to the metal wire 90 of the ceiling plate member 40, and is conducted from the metal wire 90 to the upper electrode 54 by the conductive paste 86 which is filled within the through-hole 42 for electrical connection. Voltage is applied to the piezoelectric element 46 at a predetermined timing, and, due to the vibrating plate 48 flexurally deforming in the vertical direction, the ink 110 filled in the pressure chamber 115 is pressurized, and an ink drop is ejected from the nozzle 56. Note that a flexible printed circuit (FPC) 100 also is connected to the metal wire 90.

Figure 8:
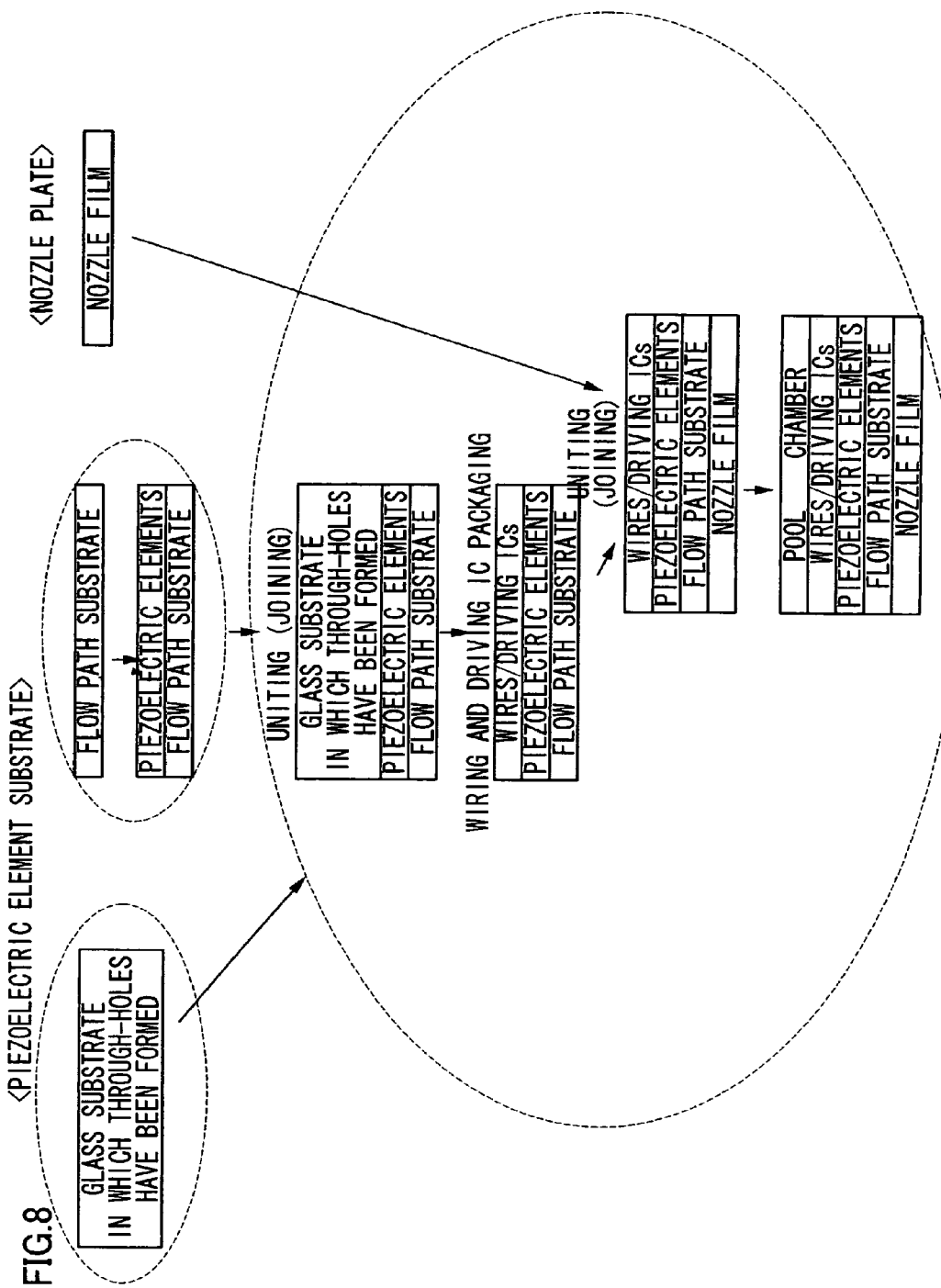
FIG. 8 is an explanatory drawing showing the overall process of manufacturing the inkjet recording head.

Next, the manufacturing processes of the inkjet recording head 32 having the above-described structure will be described in detail on the basis of FIG. 8 through FIG. 12E. As shown in FIG. 8, the inkjet recording head 32 is manufactured by fabricating the piezoelectric element substrate 70 on the top surface of the silicon substrate 72 which serves as the flow path substrate, and thereafter, joining (affixing) the nozzle plate 74 (a nozzle film 68) to the bottom surface of the silicon substrate 72.

Figure 9A:
Figure 9B:
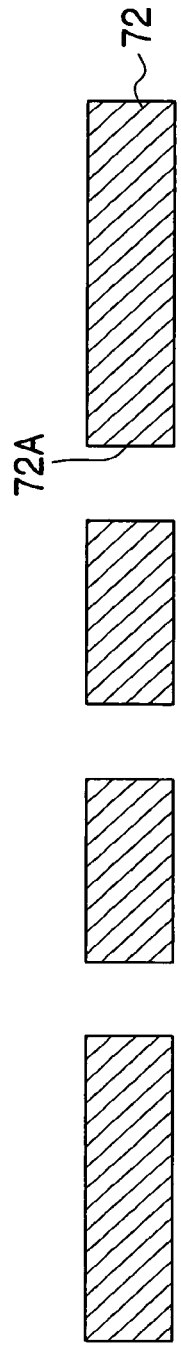

As shown in FIG. 9A, first, the silicon substrate 72 is readied. Then, as shown in FIG. 9B, opening portions 72A are formed in regions of the silicon substrate 72 which become connection paths 50, by Reactive Ion Etching (RIE). Specifically, this is resist formation by photolithography, patterning, etching by RIE, and resist removal by oxygen plasma.

Figure 9C:
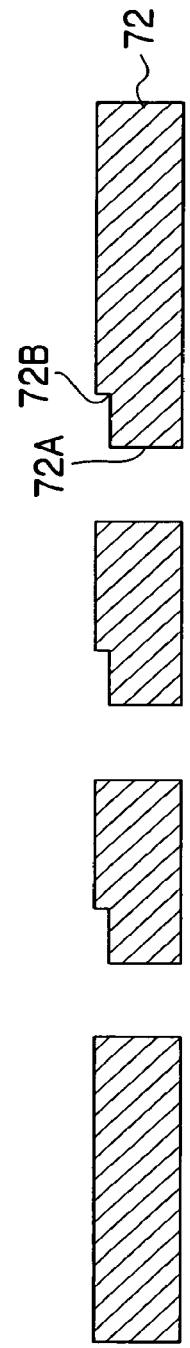

Next, as shown in FIG. 9C, groove portions 72B are formed by RIE at regions of the silicon substrate 72 which become the pressure chambers 115. Specifically, in the same way as described above, this is resist formation by photolithography, patterning, etching by RIE, and resist removal by oxygen plasma. In this way, the multi-step structure formed from the pressure chamber 115 and the connection path 50 is formed.

Figure 9D:
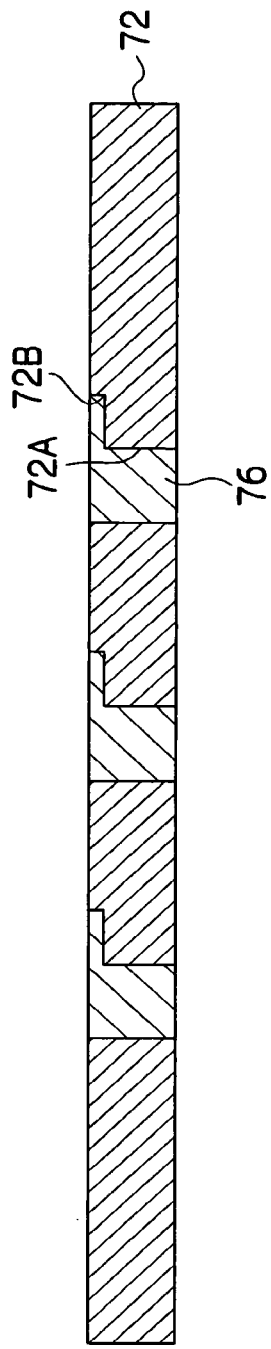

Thereafter, as shown in FIG. 9D, a glass paste 76 is filled (buried) by screen printing (refer to FIG. 11B) into the opening portions 72A which structure the connection paths 50, and the groove portions 72B which structure the pressure chambers 115. The thermal expansion coefficient of this glass paste 76 is $1 \times 10^{-6}/°$ C. to $6 \times 10^{-6}/°$ C., and the softening point thereof is 550° C. to 900° C. By using the glass paste 76 which is within this range, cracking and peeling can be prevented from arising at the glass paste 76, and further, shape distortion can be prevented from arising at the thin films which become the piezoelectric elements 46 and the vibrating plates 48.

Then, after the filling of the glass paste 76, the silicon substrate 72 is subjected to heating processing, for example, at 800° C. for 10 minutes. The temperature which is used in the curing by heat treatment of the glass paste 76 is a temperature which is higher than the film forming temperatures (e.g., 350° C.) of the piezoelectric elements 46 and the vibrating plates 48 which will be described later. In this way, the glass paste 76 can be made to be resistant to high temperatures in the film forming processes of the vibrating plates 48 and the piezoelectric elements 46. Namely, temperatures up to the temperature at which at least the glass paste 76 is cured by heat treatment can be used in later processes, and therefore, the allowable range of temperatures which can be used in the later processes is broadened. Thereafter, the top surface (obverse) of the silicon substrate 72 is polished and the excess glass paste 76 is removed, such that the top surface (obverse) is planarized. In this way, thin films and the like can be formed precisely also on the regions which become the pressure chambers 115 and the connection paths 50.

Figure 9E:
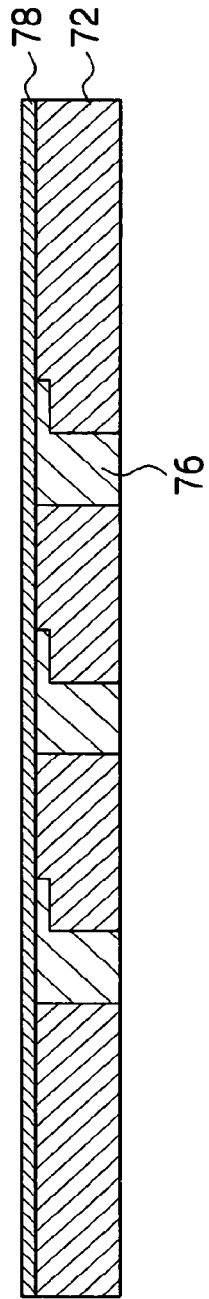

Next, as shown in FIG. 9E, a germanium (Ge) film 78 (film thickness: 1 μm) is deposited by sputtering on the top surface (obverse) of the silicon substrate 72. This Ge film 78 functions as an etching stopper layer which, when the glass paste 76 is removed by etching by a hydrogen fluoride (HF) solution in a later process, protects such that an SiOx film 82 (the vibrating plates 48), which will be described later, is not etched together therewith. Note that the Ge film 78 can also be film-formed by vapor deposition or CVD. Further, a silicon (Si) film also can be used as the etching stopper layer.

Figure 9F:
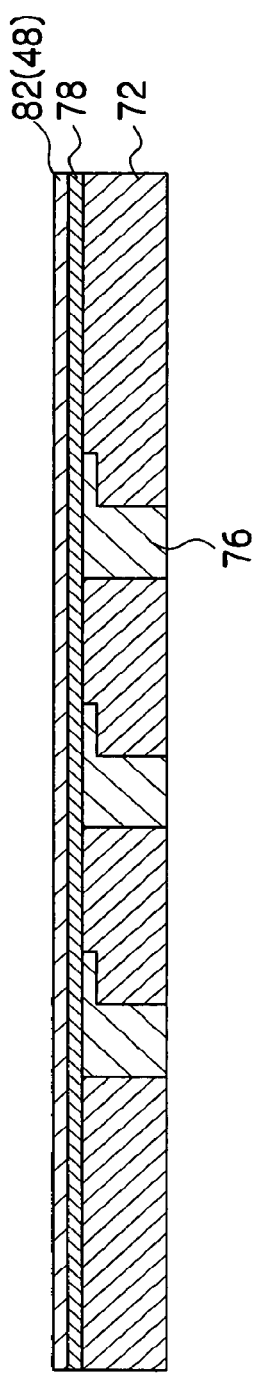

Then, as shown in FIG. 9F, the thin film which becomes the vibrating plates 48, i.e., the SiOx film 82 (film thickness: 4 μm), is film-formed on the top surface of the Ge film 78 by plasma CVD in which, for example, the temperature is 350° C., the RF power is 300 W, the frequency is 450 KHz, the pressure is 1.5 torr, and the gas is $SiH_4/N_2O = 150/4000$ sccm. Note that an SiNx film, an SiC film, a metal (Cr) film, or the like may be used as the material of the vibrating plates 48 in this case.

Figure 9G:
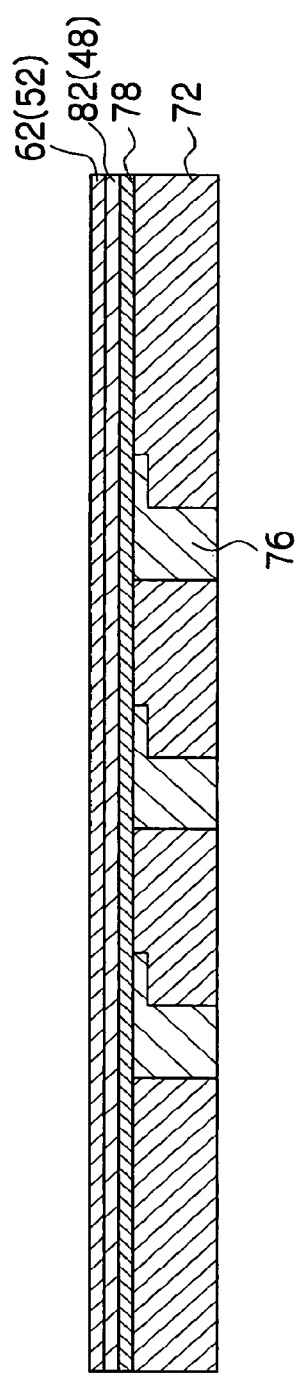
Figure 9H:
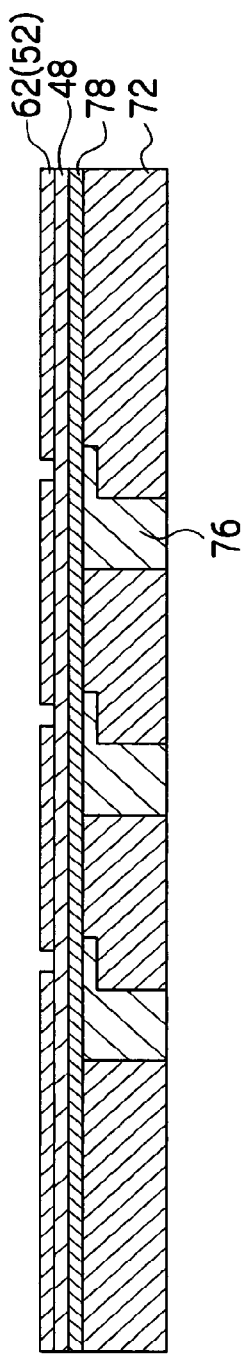

Thereafter, as shown in FIG. 9G, an Au film 62 of a thickness of about 0.5 μm for example, i.e., the lower electrodes 52, is film-formed by sputtering. Then, as shown in FIG. 9H, the lower electrodes 52, which are layered on the top surfaces of the vibrating plates 48, are patterned. Specifically, this is resist formation by photolithography, patterning, etching by RIE, and resist removal by oxygen plasma. The lower electrodes 52 are ground potential.

Figure 9I:
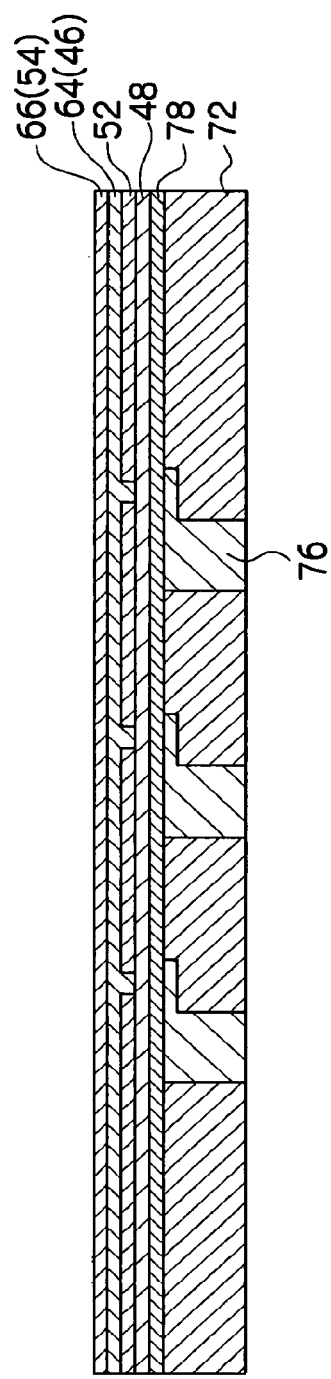
Figure 9J:
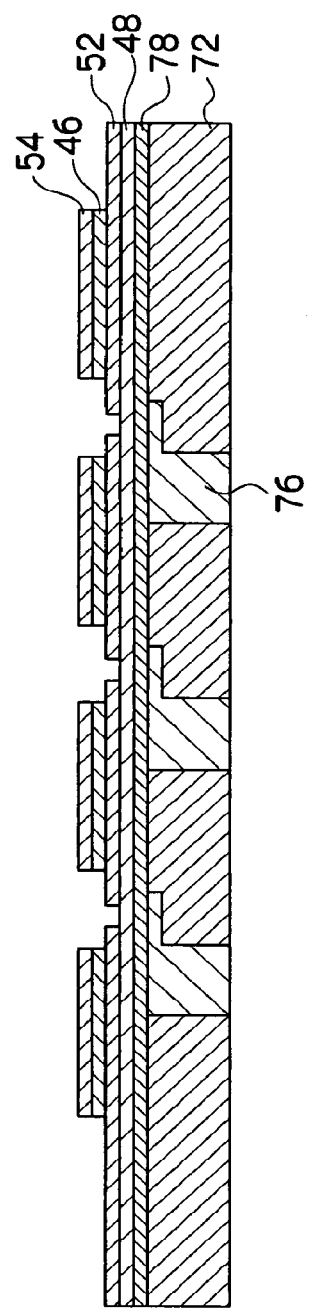

Next, as shown in FIG. 9I, a PZT film 64, which is the material of the piezoelectric elements 46, and an Au film 66, which becomes the upper electrodes 54, are layered in order by sputtering on the top surfaces of the lower electrodes 52. As shown in FIG. 9J, the piezoelectric elements 46 (the PZT film 64) and the upper electrodes 54 (the Au film 66) are patterned. Specifically, this is sputtering of the PZT film (film thickness: 5 μm), sputtering of the Au film (film thickness: 0.5 μm), resist formation by photolithography, patterning (etching), and resist removal by oxygen plasma. The upper and lower electrode materials have high affinity with the PZT material which is the piezoelectric elements 46, and are heat-resistant. Examples include Au, Ir, Ru, Pt, and the like.

Thereafter, as shown in FIG. 9K, hole portions 82A for formation of the ink supply paths 114 are patterned in the vibrating plates 48 (the SiOx film 82). Specifically, this is resist formation by photolithography, patterning (HF etching), and resist removal by oxygen plasma.

Next, as shown in FIG. 9L, the low water permeable insulating films (SiOx films) 80 are layered on the top surfaces of the lower electrodes 52 and the upper electrodes 54 whose top surfaces are exposed. Then, openings 84 (contact holes) for connecting the upper electrodes 54 and the metal wires 90 are formed by patterning. Specifically, this is deposition by CVD of the low water permeable insulating films (SiOx films) 80 whose dangling bond density is high, resist formation by photolithography, patterning (HF etching), and resist removal by oxygen plasma. Note that, although an SiOx film is used as the low water permeable insulating film here, an SiNx film, an SiOxNy film, or the like may be used.

Next, as shown in FIG. 9M, the partitioning resin layers 119 and the partitioning resin layers 118 are patterned. Specifically, a photosensitive resin which structures the partitioning resin layers 119 and the partitioning resin layers 118 is coated, and a pattern is formed by exposure and development, and finally, curing is carried out. At this time, the through-holes 44 for ink supply are formed in the partitioning resin layers 119. Note that, although the partitioning resin layers 119 and the partitioning resin layers 118 are the same film, the design patterns thereof are different. Further, it suffices for the photosensitive resin which structures the partitioning resin layers 119 and the partitioning resin layers 118 to be ink resistant, such as a polyimide resin, a polyamide resin, an epoxy resin, a polyurethane resin, a silicone resin, or the like.

The piezoelectric element substrate 70 is fabricated on the top surface of the silicon substrate 72 (the flow path substrate) in this way, and the ceiling plate member 40, whose support is a glass plate for example, is united (joined) to the top surface of the piezoelectric element substrate 70. In the manufacturing of the ceiling plate member 40, as shown in FIG. 10A, because the ceiling plate member 40 includes the ceiling plate 41 which is of a thickness (0.3 mm to 1.5 mm) which can ensure strength of an extent that the ceiling plate member 40 itself is a support, there is no need to provide a separate support. As shown in FIG. 10B, the through-holes 112 for ink supply and the through-holes 42 for electrical connection are formed in the ceiling plate 41.

Specifically, a resist of a photosensitive dry film is patterned by photolithography, and, by using this resist as a mask, sandblasting processing is carried out and the openings are formed, and thereafter, the resist is removed by oxygen plasma. Note that the through-holes 112 for ink supply and the through-holes 42 for electrical connection are formed, as seen in sectional view, in taper-shapes (in the shapes of funnels) such that the inner surfaces thereof gradually approach toward the bottom.

Figure 11A:
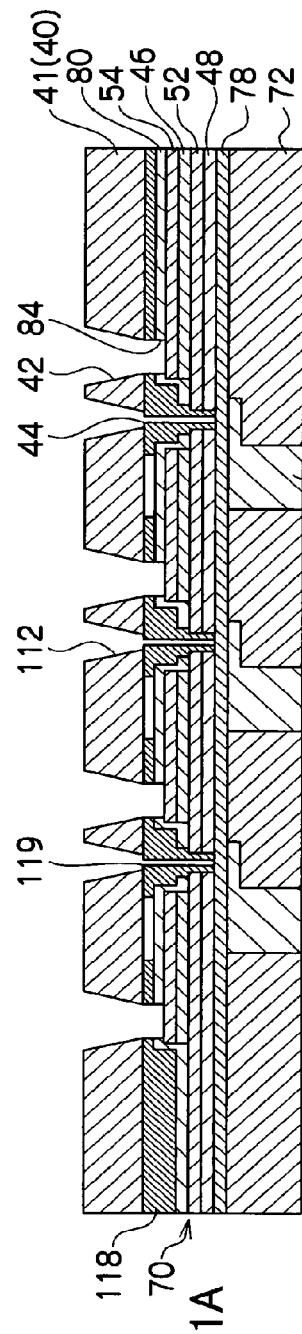

The ceiling plate 41 (the ceiling plate member 40), in which the through-holes 112 for ink supply and the through-holes 42 for electrical connection are formed in this way, is placed on the piezoelectric element substrate 70 as shown in FIG. 11A, and the both are united (joined) by thermocompression bonding (e.g., 20 minutes at 350° C. and 2 kg/cm$^2$). At this time, because the partitioning resin layers 119 and the partitioning resin layers 118 are structured so as to be in the same plane (the same height), the contacting ability thereof when contacted by the ceiling plate 41 improves, and they can be joined with high sealability.

Figure 11B:
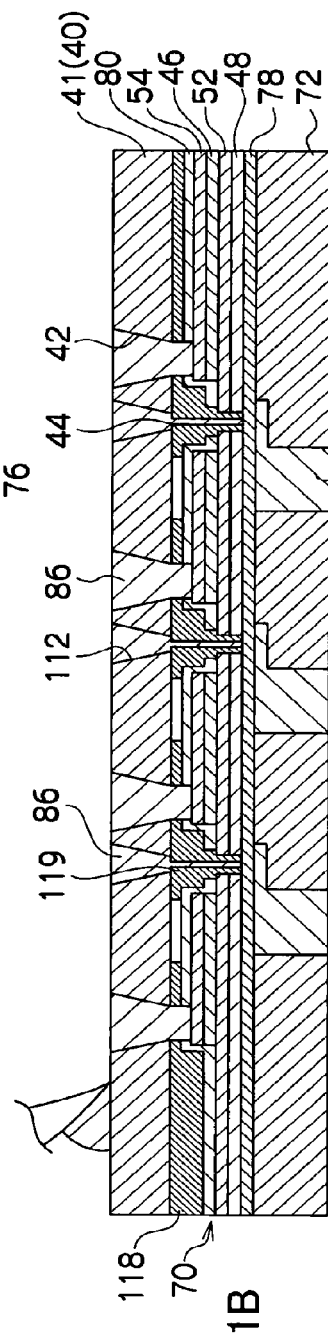

Then, as shown in FIG. 11B, the conductive paste 86 (e.g., a thermoplastic paste such as Dotite AE1650, Staystick 191, or the like, or a polyurethane paste such as Peltron K-3434 or the like, or a silver paste such as Dotite XA-410S-10 or the like) is filled (buried) into the through-holes 42 for electrical connection and the through-holes 112, 44 for ink supply by screen printing (or by direct squeezing), and subjected to curing processing. Thereafter, the top surface (obverse) thereof is polished and planarized.

Figure 11C:
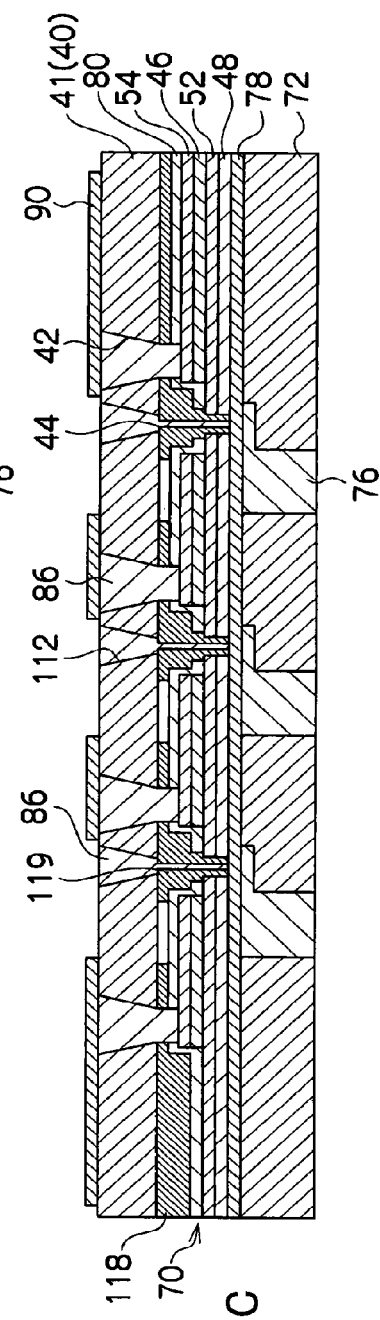

Next, as shown in FIG. 11C, the metal wires 90 are film-formed on the top surface of the ceiling plate 41 and patterned. Specifically, this is deposition of an Al film (film thickness: 1 μm) by sputtering, resist formation by photolithography, wet etching of the Al film by using an $H_3PO_4$ chemical liquid, and resist removal by acetone (or oxygen plasma).

Next, as shown in FIG. 11D, the resin protective film 92 (e.g., photosensitive polyimide Durimide 7320 manufactured by FUJIFILM Electronics Materials Co., Ltd.) is layered on surfaces where the metal wires 90 are formed, and is patterned. Note that, at this time, the resin protective film 92 does not cover the through-holes 112 for ink supply (the first ink supply paths 114A). Further, it suffices for the resin protective film 92 to be ink resistant, such as a polyimide resin, a polyamide resin, an epoxy resin, a polyurethane resin, a silicone resin, or the like. Moreover, it suffices for an SiC film to be used as the resin protective film 92.

Next, as shown in FIG. 11E, the glass paste 76 which is filled (buried) in the silicon substrate 72 is selectively removed by etching by a dissolving solution containing HF. Because the vibrating plates 48 formed from the SiOx film 82 are protected from the HF solution by the Ge film 78 at this time, the vibrating plates 48 are not etched. Namely, as described above, the Ge film 78 functions as an etching stopper layer which, at the time when the glass paste 76 is removed by etching by the HF solution, prevents the vibrating plates 48 formed from the SiOx film 82 from being removed by etching together therewith.

Note that, although a liquid containing HF is used in the removal of the glass paste 76 here, a gas or vapor containing HF may be used in the removal of the glass paste 76. If the etching liquid is supplied from a narrow entrance, there are cases in which the progress of the etching is impeded because the bubbles arising at the time of etching the material to be etched (the glass paste 76 in this case) cannot be removed, and replacement with new etching liquid is not possible. When gas or vapor is used, such a problems does not arise. Therefore, in a case such as described above, it is preferable to use a gas or vapor. Further, if the HF solution or the gas or vapor containing HF, which etches the glass paste 76, is structured so as to not etch the material which becomes the vibrating plates 48, an etching stopper layer such as the Ge film 78 is not necessary.

Thereafter, as shown in FIG. 11F, a dissolving solution of the Ge film 78, e.g., hydrogen peroxide ($H_2O_2$) which is heated to 60° C. for example, is supplied from the pressure chamber 115 side, and portions of the Ge film 78 are removed by etching. At this stage, the pressure chambers 115 and the connection paths 50 are completed. Note that, at regions other than those forming the pressure chambers 115 and the connection paths 50, there is no particular problem in leaving the Ge film 78 as is.

When the Ge film 78 has been etched in this way, as shown in FIG. 11G, the conductive paste 86 within the through-holes 112 for ink supply are removed by wet etching by a predetermined stripping liquid (paste stripping agent). Note that, at this time, because the metal wires 90 are covered and protected by the resin protective films 92, there is no fear that the metal wires 90 will be damaged. Further, because the conductive paste 86 within the through-holes 42 for electrical connection as well is covered and protected by the resin protective films 92, there also is no fear that the conductive paste 86 within the through-holes 42 for electrical connection will be removed by etching. When the conductive paste 86 within the through-holes 112 for ink supply has been removed by etching, curing processing of the resin protective film 92 is carried out.

Figure 12A:
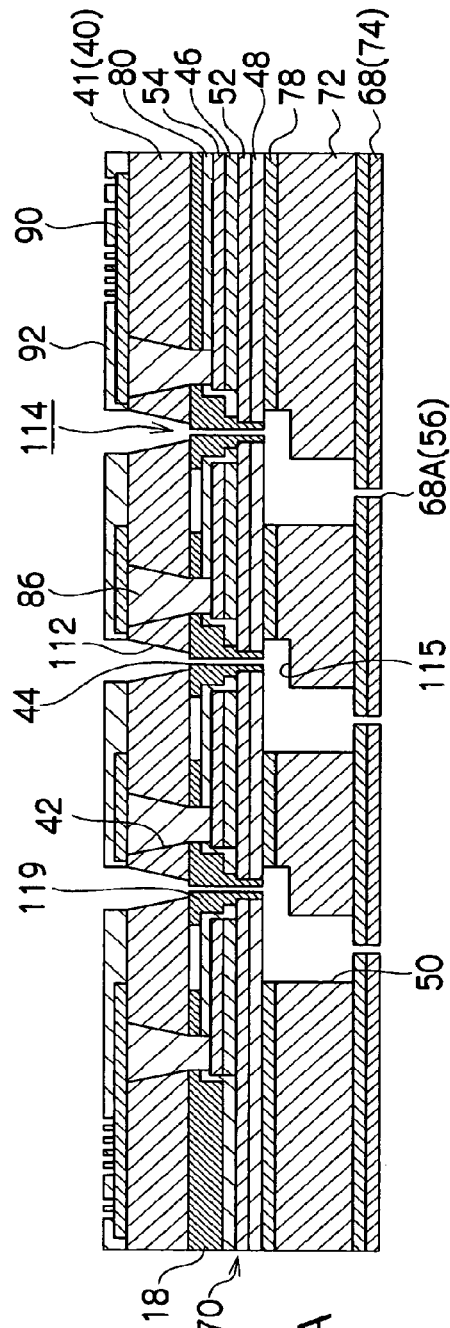
FIG. 12A to FIG. 12E are explanatory drawings showing process relating to the first exemplary embodiment of the present invention, after joining a nozzle plate to the silicon substrate.
Figure 12B:
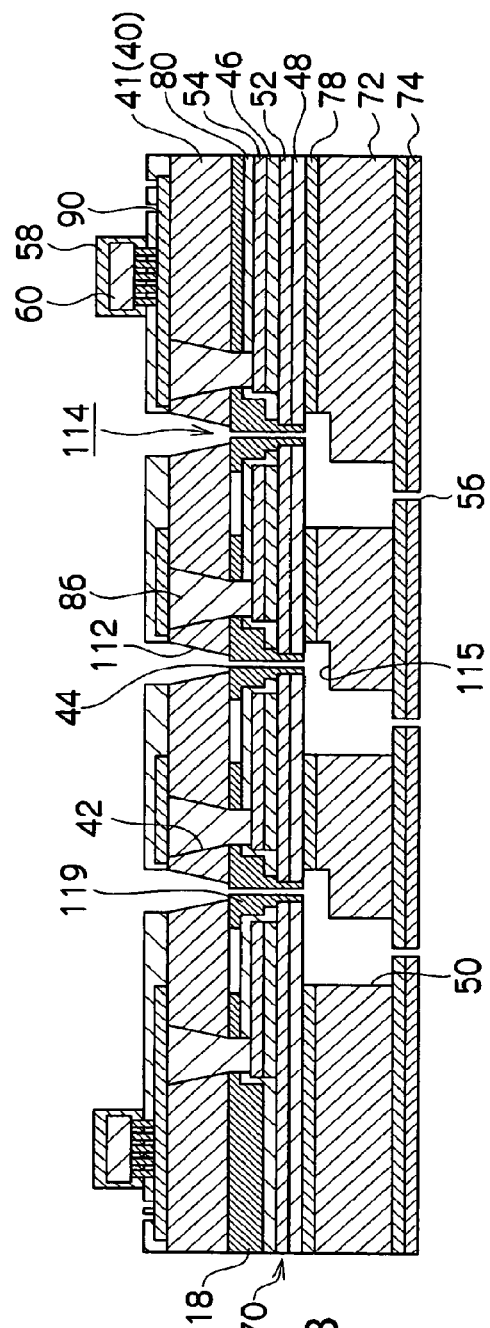

Next, the nozzle plate 74 is affixed to the bottom surface of the silicon substrate 72. Namely, as shown in FIG. 12A, the nozzle film 68, in which openings 68A which become the nozzles 56 are formed, is affixed to the bottom surface of the silicon substrate 72. Thereafter, as shown in FIG. 12B, the driving ICs 60 are flip-chip packaged to the metal wires 90. At this time, the driving ICs 60 are machined to a predetermined thickness (70 μm to 300 μm) in a grinding process which is carried out in advance at the end of the semiconductor wafer process.

Figure 12C:
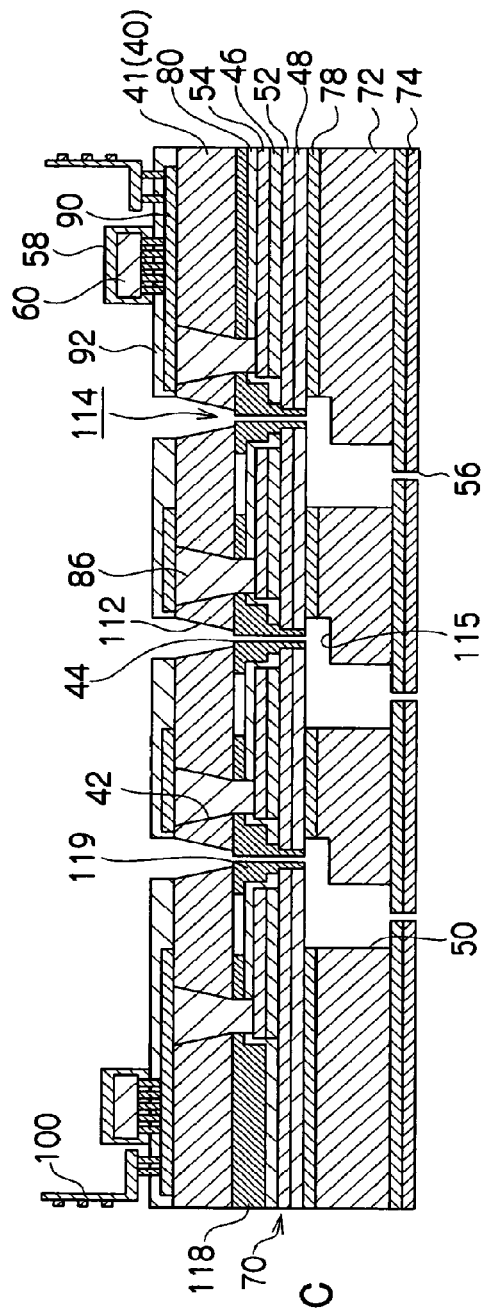

Then, the peripheries of the driving ICs 60 are sealed by the resin material 58, such that the driving ICs 60 can be protected from the external environment such as moisture or the like. In this way, it is possible to avoid damage in later processes, for example, damage due to water or ground fragments at the time of dividing the finished piezoelectric element substrate 70 into the inkjet recording heads 32 by dicing. Then, as shown in FIG. 12C, the flexible printed circuit (FPC) 100 is connected to the metal wires 90.

Figure 12D:
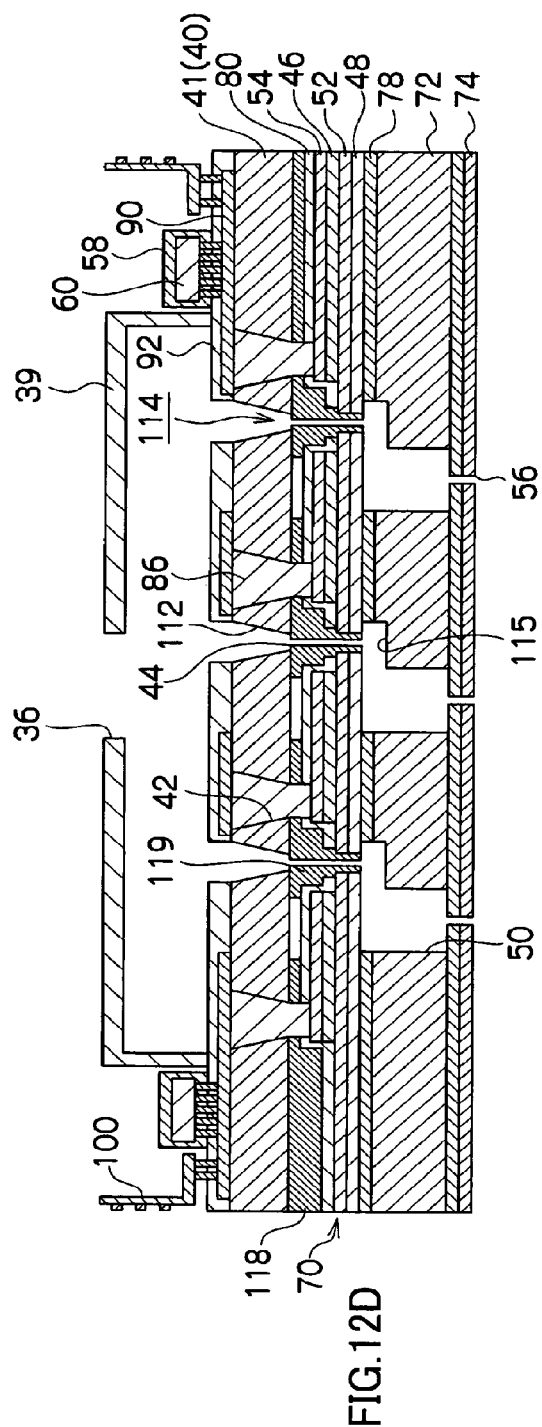
Figure 12E:
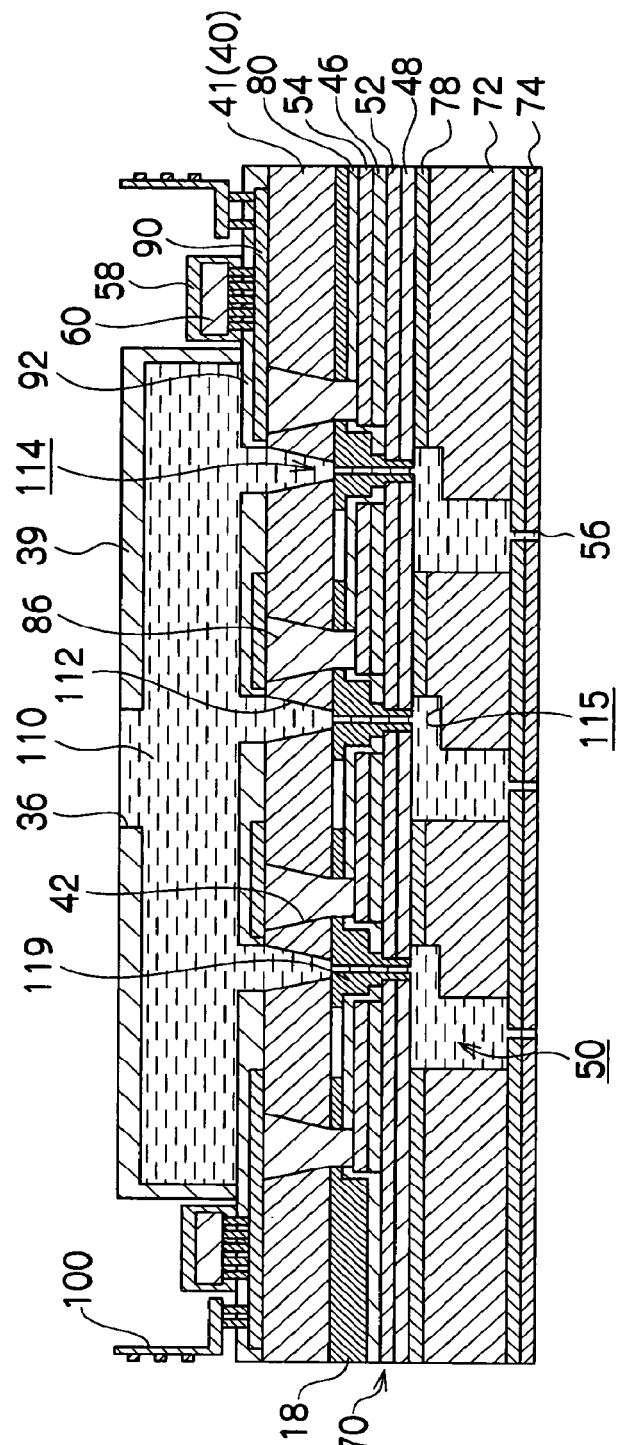

Then, as shown in FIG. 12D, the pool chamber material 39 is installed on the top surface of the ceiling plate member 40 (the ceiling plate 41), further toward the inner side than the driving ICs 60, and the ink pool chamber 38 is formed therebetween. In this way, the inkjet recording head 32 is completed, and as shown in FIG. 12E, the ink 110 can be filled into the ink pool chamber 38 and the pressure chambers 115.

The operation of the inkjet recording device 10, which has the inkjet recording head 32 manufactured as described above, will be described next. First, when an electric signal which instructs printing is sent to the inkjet recording device 10, one of the recording sheets P is picked-up from the stocker 24, and is conveyed by the conveying device 26.

On the other hand, at the inkjet recording unit 30, the ink 110 has already been injected-in (filled-in) in the ink pool chamber 38 of the inkjet recording head 32 from the ink tank via the ink supply port. The ink 110 which is filled in the ink pool chamber 38 is supplied to (filled into) the pressure chambers 115 via the ink supply paths 114. At this time, a meniscus, in which the surface of the ink 110 is slightly concave toward the pressure chamber 115 side, is formed at the distal end (the ejecting opening) of the nozzle 56.

While the recording sheet P is conveyed, due to ink drops being selectively expelled from the plural nozzles 56, a portion of the image based on the image data is recorded. Namely, voltage is applied to predetermined piezoelectric elements 46 at a predetermined timing by the driving ICs 60, the vibrating plates 48 are flexurally deformed in the vertical direction (are out-of-plane vibrated), pressure is applied to the ink 110 within the pressure chambers 115, and the ink 110 is ejected as ink drops from predetermined nozzles 56. When the image based on the image data has been completely recorded on the recording sheet P, the recording sheet P is discharged-out to the tray 25 by the sheet discharging belt 23. In this way, the printing processing (image recording) onto the recording sheet P is completed.

Here, the inkjet recording head 32 is structured such that the vibrating plates 48 (the piezoelectric elements 46) are disposed between the ink pool chamber 38 and the pressure chambers 115, and the ink pool chamber 38 and the pressure chambers 115 do not exist on the same horizontal plane.

Accordingly, the pressure chambers 115 can be disposed close to one another, and the nozzles 56 can be arranged at a high density.

Further, the driving ICs 60 which apply voltage to the piezoelectric elements 46 are structured so as to not project-out further toward the outer side than the piezoelectric element substrate 70 (i.e., are incorporated within the inkjet recording head 32). Accordingly, as compared with a case in which the driving ICs 60 are packaged at the exterior of the inkjet recording head 32, it suffices for the lengths of the metal wires 90 which connect the piezoelectric elements 46 and the driving ICs 60 to be short, and a lowering of resistance from the driving ICs 60 to the piezoelectric elements 46 is thereby realized.

Namely, making the nozzles 56 high-density, i.e., arranging the nozzles 56 in a high-density matrix, is realized at a practical wiring resistance value. In this way, increased resolution can be realized. Moreover, because the driving ICs 60 are flip-chip packaged on the ceiling plate 41, high-density wiring connection can be achieved easily, and further, a reduction in the heights of the driving ICs 60 can be aimed for (the driving ICs 60 can be made to be thin). Accordingly, compactness of the inkjet recording head 32 is realized.

Further, because the driving ICs 60 and the upper electrodes 54 are connected by the conductive paste 86 within the through-holes 42 for electrical connection which are formed in the ceiling plate 41, the ceiling plate member 40 and the piezoelectric element substrate 70 can be electrically connected without forming wires or bumps on the reverse surface (bottom surface) of the ceiling plate 41. Namely, because it suffices to machine only one surface (the top surface) of the ceiling plate 41, manufacturing is easy. Further, substantially only the metal wires 90, the upper electrodes 54, and the conductive paste 86 exist at the connection portions of the metal wires 90 and the upper electrodes 54, and these are resistant to high temperatures. Therefore, the degrees of freedom in selecting the methods of machining and the materials increase, and miniaturization and higher density can easily be realized.

At the time of forming (film-forming) the metal wires 90 at the ceiling plate 41, the through-holes 42 for electrical connection and the through-holes 112, 44 for ink supply are completely closed-up by the conductive paste 86, and the top surfaces (obverses) thereof are polished and planarized (made into a state in which there are no hole portions). Therefore, formation (film formation) can be easily carried out by a spinning method. In this way, the in-plane uniformity of the resin protective film 92 which covers the metal wires 90 is good, and film formation can be controlled easily. Therefore, making the resin protective film 92 a thick film can be realized easily. Accordingly, a decrease in produceability can be prevented.

Because the conductive paste 86 is buried-in by screen printing, it can be reliably buried-in even into the deep through-holes 42 for electrical connection and through-holes 112, 44 for ink supply. Further, because the metal wires 90 are covered by the resin protective film 92, corrosion of the metal wires 90 by the ink 110 can be prevented. Note that, when the filling material is only the conductive paste 86, there is also the advantage that manufacturing is low-cost and easy. Moreover, because formation is carried out with the silicon substrate 72 being the support of the piezoelectric element substrate 70 (i.e., because the piezoelectric element substrate 70 can be fabricated in a state of being supported by the silicon substrate 72), there is also the advantage that it is easy to manufacture the inkjet recording head 32 overall.

Second Exemplary Embodiment

The inkjet recording head 32 of a second exemplary embodiment will be described next. Note that, hereinafter, structural elements, members, and the like which are the same as those of the inkjet recording head 32 of the first exemplary embodiment are denoted by the same reference numerals, and detailed description thereof (including description of the operation) will be omitted. Further, only the method of manufacture (the manufacturing processes) of the inkjet recording head 32 of the second exemplary embodiment which differs from that of the inkjet recording head of the first exemplary embodiment will be described on the basis of FIG. 13A to FIG. 13I. Namely, the processes, up to the manufacturing processes explained in FIG. 10A and FIG. 10B in the manufacturing processes of the inkjet recording head of the first exemplary embodiment, are the same, and therefore, description of the manufacturing processes until then is omitted.

Figure 13A:
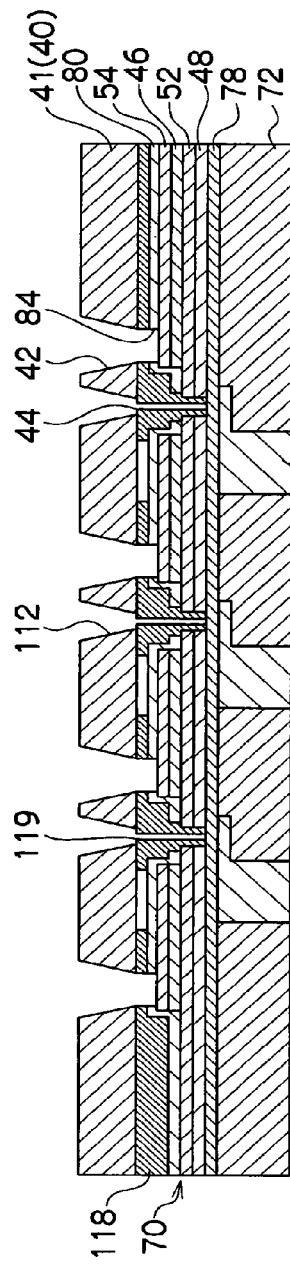
Figure 13B:
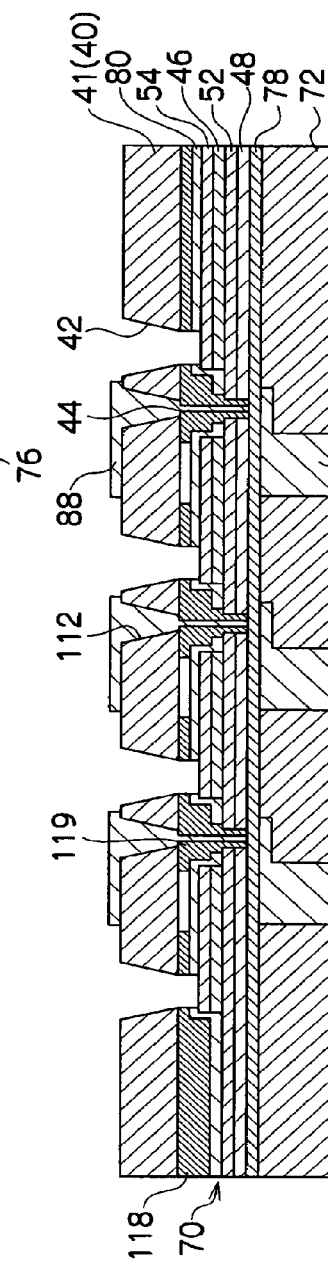

As shown in FIG. 13A, the ceiling plate 41 is placed on the piezoelectric element substrate 70, and when the both have been united (joined) by thermocompression bonding (e.g., 20 minutes at 350° C. and 2 kg/cm$^2$), a negative photosensitive resin material 88 (e.g., photosensitive polyimide Durimide 7520 manufactured by FUJIFILM Electronics Materials Co., Ltd., or photosensitive rubber resist SC-450) serving as a sacrificial material is filled (buried) in the through-holes 42 for electrical connection and the through-holes 112, 44 for ink supply. Then, an unillustrated mask is formed on the through-holes 42 for electrical connection and exposed, and, as shown in FIG. 13B, the negative photosensitive resin material 88 within the through-holes 42 for electrical connection is removed.

Figure 13C:
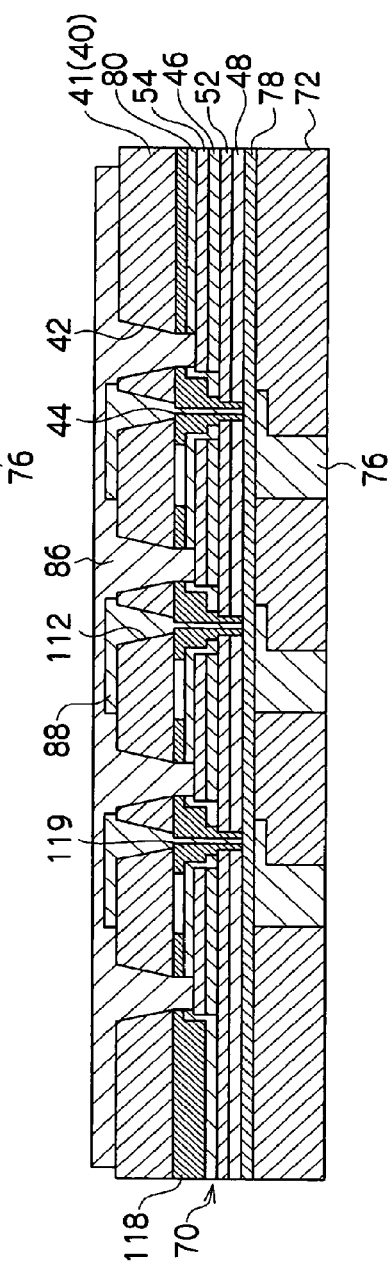

Thereafter, as shown in FIG. 13C, the conductive paste 86 (e.g., a thermoplastic paste such as Dotite AE1650, Staystick 191, or the like, or a polyurethane paste such as Peltron K-3434 or the like, or a silver paste such as Dotite XA-410S-10 or the like) is squeezed on the entire top surface (obverse) including the through-holes 42 for electrical connection. Then, as shown in FIG. 13D, the top surface (obverse) is polished and planarized.

Next, as shown in FIG. 13E, the metal wires 90 are film-formed on the top surface of the ceiling plate 41 and patterned. Specifically, this is deposition of an Al film (thickness: 1 μm) by sputtering, resist formation by photolithography, wet etching of the Al film by using an $H_3PO_4$ chemical liquid, and resist removal by acetone (or oxygen plasma). Note that, at this time, the through-holes 42 for electrical connection are closed-up by the conductive paste 86, the through-holes 112, 44 for ink supply are closed-up by the negative photosensitive resin material 88, and the top surfaces (obverses) thereof are planarized. Therefore, the metal wires 90 can easily be formed (film-formed) by a spinning method.

Then, as shown in FIG. 13F, the resin protective film 92 (e.g., photosensitive polyimide Durimide 7320 manufactured by FUJIFILM Electronics Materials Co., Ltd.) is layered on surfaces where the metal wires 90 are formed, and is patterned. Note that, at this time, the resin protective film 92 does not cover the through-holes 112 for ink supply (the first ink supply paths 114A). Further, in accordance with the above-described structure, the in-plane uniformity of the resin protective film 92 is good, and film formation can be controlled easily. Therefore, making the resin protective film 92 a thick film can be realized easily. Moreover, it suffices for an SiC film to be used as the resin protective film 92.

Figure 13H:
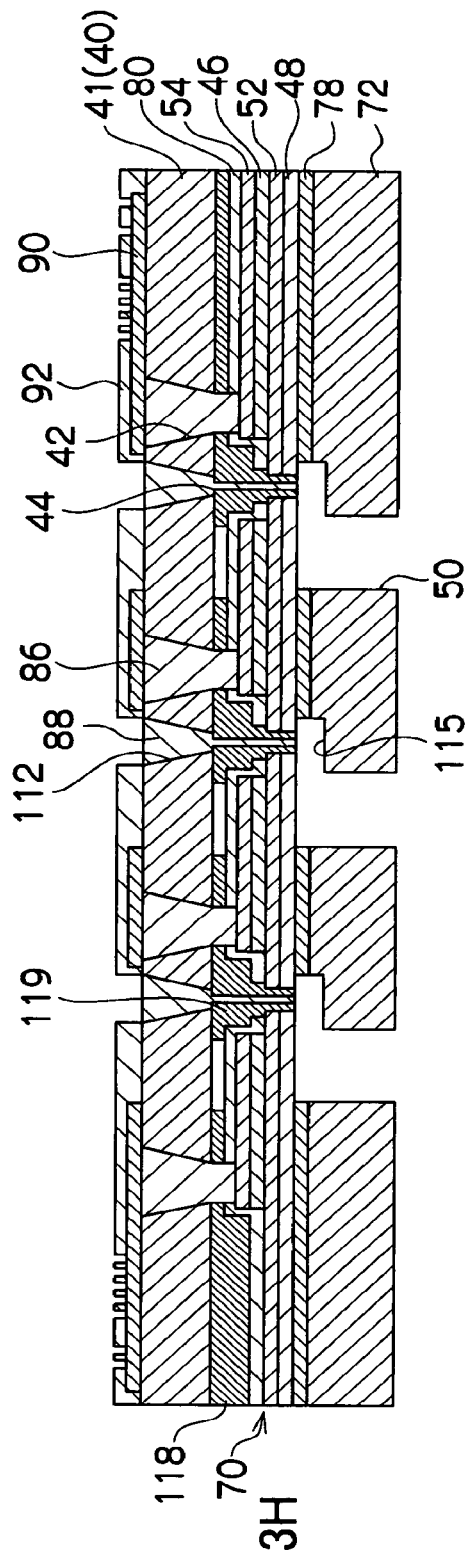

Next, as shown in FIG. 13G, the glass paste 76 which is filled (buried) in the silicon substrate 72 is selectively removed by etching by a dissolving solution containing HF. Thereafter, as shown in FIG. 13H, a dissolving solution of the Ge film 78, e.g., hydrogen peroxide ($H_2O_2$) which is heated to 60° C. for example, is supplied from the pressure chamber 115 side, and portions of the Ge film 78 are removed by etching. At this stage, the pressure chambers 115 and the connection paths 50 are completed.

Figure 13I:
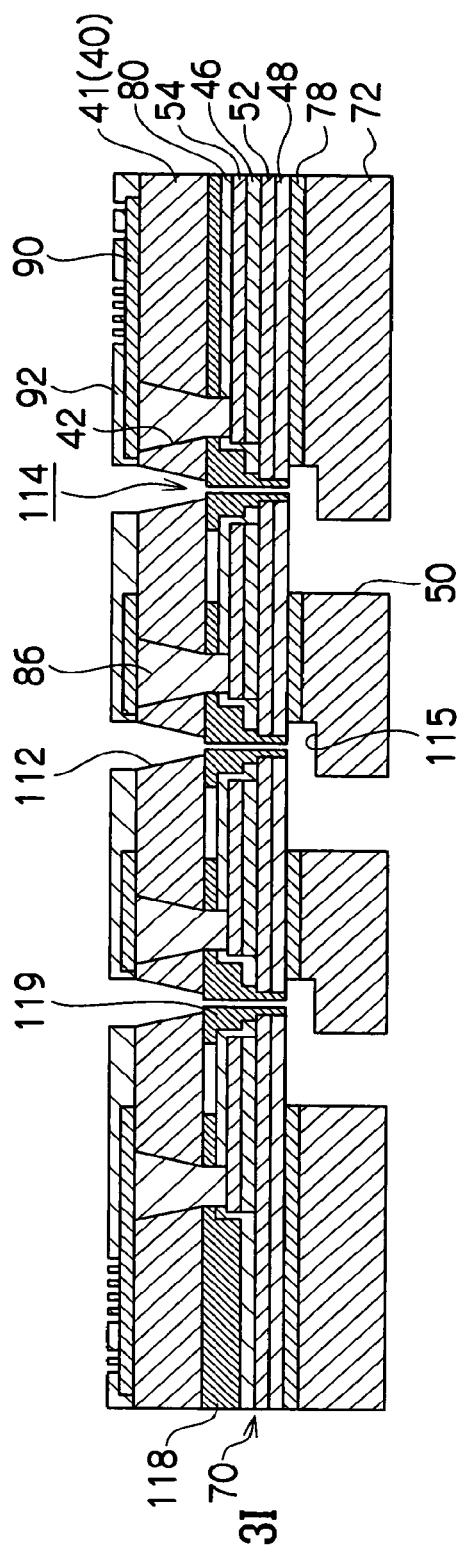

When the Ge film 78 has been etched in this way, as shown in FIG. 13I, the negative photosensitive resin material 88 within the through-holes 112 for ink supply is wet-etched and removed by a predetermined stripping liquid (NMP liquid and QZ3322 stripping liquid). Note that, at this time, because the metal wires 90 are covered and protected by the resin protective films 92, there is no fear that the metal wires 90 will be damaged. Further, because the conductive paste 86 as well is covered and protected by the resin protective films 92, there also is no fear that the conductive paste 86 will be removed by etching.

When the negative photosensitive resin material 88 within the through-holes 112 for ink supply has been removed by etching, curing processing of the resin protective film 92 and the conductive paste 86 is carried out. Note that, because the negative photosensitive resin material 88 can simply be removed by etching, there is the advantage that manufacturing is easy. Further, because processes thereafter are similar to those in the case of the above-described inkjet recording head 32 of the first exemplary embodiment, description thereof is omitted.

Third Exemplary Embodiment

The inkjet recording head 32 of a third exemplary embodiment will be described next. Note that, hereinafter, structural elements, members, and the like which are the same as those of the inkjet recording head 32 of the first exemplary embodiment are denoted by the same reference numerals, and detailed description thereof (including description of the operation) will be omitted. Further, only the method of manufacture (the manufacturing processes) of the inkjet recording head 32 of the third exemplary embodiment which differs from that of the inkjet recording head 32 of the first exemplary embodiment will be described on the basis of FIG. 14A to FIG. 14I. Namely, the processes, up to the manufacturing processes explained in FIG. 10A and FIG. 10B in the manufacturing processes of the inkjet recording head 32 of the first exemplary embodiment, are the same, and therefore, description of the manufacturing processes until then is omitted.

Figure 14A:
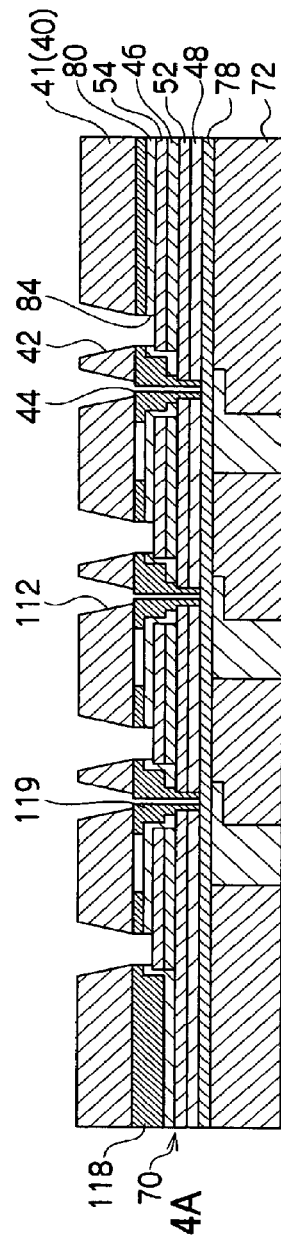
Figure 14B:
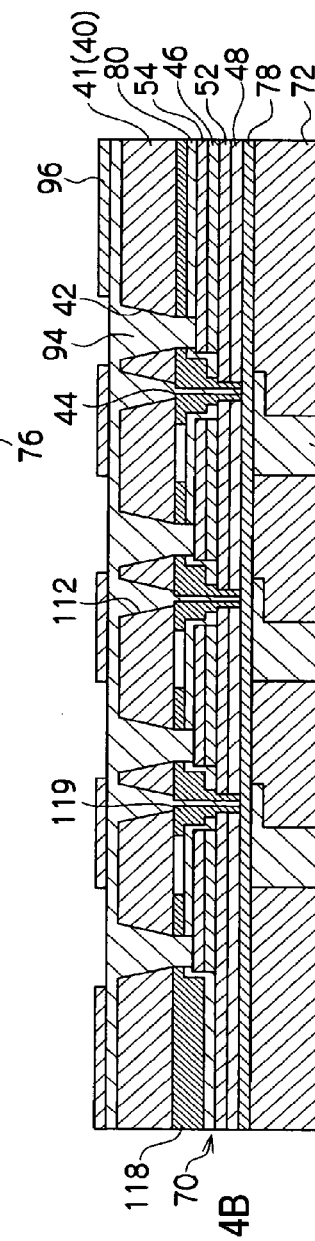
Figure 14C:
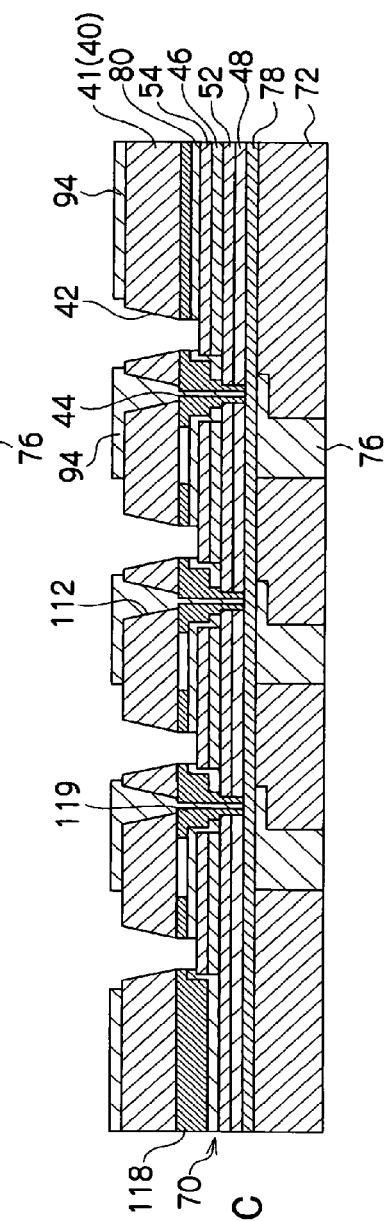

As shown in FIG. 14A, the ceiling plate 41 is placed on the piezoelectric element substrate 70, and when the both have been united (joined) by thermocompression bonding (e.g., 20 minutes at 350° C. and 2 kg/cm$^2$), as shown in FIG. 14B, a positive photosensitive resin material 94 (e.g., PMGI, LOR, KMPR-1000 manufactured by Kayaku Microchem) serving as a sacrificial material is filled (buried) completely in the through-holes 42 for electrical connection and the through-holes 112, 44 for ink supply. Then, a mask 96 (a metal film or the like) is formed above the through-holes 42 for electrical connection and exposed, and, as shown in FIG. 14C, the positive photosensitive resin material 94 within the through-holes 42 for electrical connection is removed.

Thereafter, as shown in FIG. 14D, the conductive paste 86 (e.g., a thermoplastic paste such as Dotite AE1650, Staystick 191, or the like, or a polyurethane paste such as Peltron K-3434 or the like, or a silver paste such as Dotite XA-410S-10 or the like) is squeezed on the entire top surface (obverse) including the through-holes 42 for electrical connection, and the top surface (obverse) is polished and planarized.

Next, as shown in FIG. 14E, the metal wires 90 are film-formed on the top surface of the ceiling plate 41 and patterned. Specifically, this is deposition of an Al film (thickness: 1 μm) by sputtering, resist formation by photolithography, wet etching of the Al film by using an $H_3PO_4$ chemical liquid, and resist removal by acetone (or oxygen plasma). Note that, at this time, the through-holes 42 for electrical connection are closed-up by the conductive paste 86, the through-holes 112, 44 for ink supply are closed-up by the positive photosensitive resin material 94, and the top surfaces (obverses) thereof are planarized. Therefore, the metal wires 90 can easily be formed (film-formed) by a spinning method.

Figure 14F:
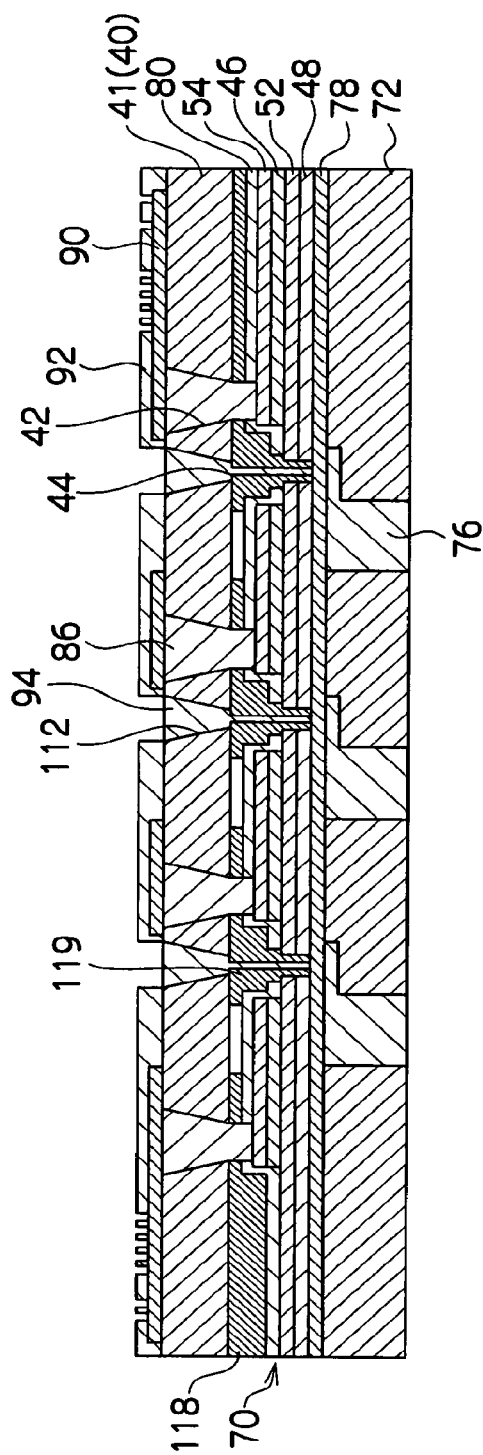

Then, as shown in FIG. 14F, the resin protective film 92 (e.g., photosensitive polyimide Durimide 7320 manufactured by FUJIFILM Electronics Materials Co., Ltd.) is layered on the surfaces where the metal wires 90 are formed, and is patterned. Note that, at this time, the resin protective film 92 does not cover the through-holes 112 for ink supply (the first ink supply paths 114A). Further, in accordance with the above-described structure, the in-plane uniformity of the resin protective film 92 is good, and film formation can be controlled easily. Therefore, making the resin protective film 92 a thick film can be realized easily. Moreover, it suffices for an SiC film to be used as the resin protective film 92.

Figure 14G:
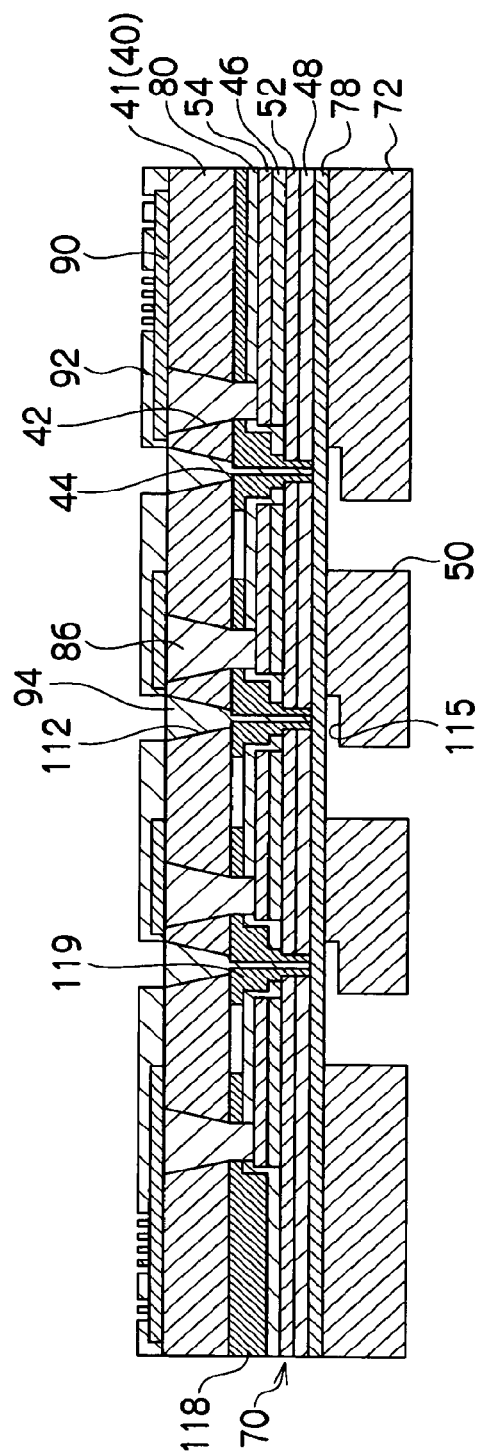

Next, as shown in FIG. 14G, the glass paste 76 which is filled (buried) in the silicon substrate 72 is selectively removed by etching by a dissolving solution containing HF. Thereafter, as shown in FIG. 14H, a dissolving solution of the Ge film 78, e.g., hydrogen peroxide ($H_2O_2$) which is heated to 60° C. for example, is supplied from the pressure chamber 115 side, and portions of the Ge film 78 are etched and removed. At this stage, the pressure chambers 115 and the connection paths 50 are completed.

When the Ge film 78 has been etched in this way, as shown in FIG. 14I, the positive photosensitive resin material 94 within the through-holes 112 for ink supply is wet-etched and removed by a predetermined stripping liquid (a resist stripping liquid). Note that, at this time, because the metal wires 90 are covered and protected by the resin protective films 92, there is no fear that the metal wires 90 will be damaged. Further, because the conductive paste 86 as well is covered and protected by the resin protective films 92, there also is no fear that the conductive paste 86 will be removed by etching.

When the positive photosensitive resin material 94 within the through-holes 112 for ink supply has been removed by etching, curing processing of the resin protective film 92 and the conductive paste 86 is carried out. Note that, because the positive photosensitive resin material 94 can simply be removed by etching, there is the advantage that manufacturing is easy. Further, because processes thereafter are similar to those in the case of the above-described inkjet recording head 32 of the first exemplary embodiment, description thereof is omitted.

Fourth Exemplary Embodiment

The inkjet recording head 32 of a fourth exemplary embodiment will be described next. Note that, hereinafter, structural elements, members, and the like which are the same as those of the inkjet recording head 32 of the first exemplary embodiment are denoted by the same reference numerals, and detailed description thereof (including description of the operation) will be omitted. Further, only the method of manufacture (the manufacturing processes) of the inkjet recording head 32 of the fourth exemplary embodiment which differs from that of the inkjet recording head 32 of the first exemplary embodiment will be described on the basis of FIG. 15A to FIG. 15H. Namely, the processes, up to the manufacturing processes explained in FIG. 10A and FIG. 10B in the manufacturing processes of the inkjet recording head of the first exemplary embodiment, are the same, and therefore, description of the manufacturing processes until then is omitted.

Figure 15A:
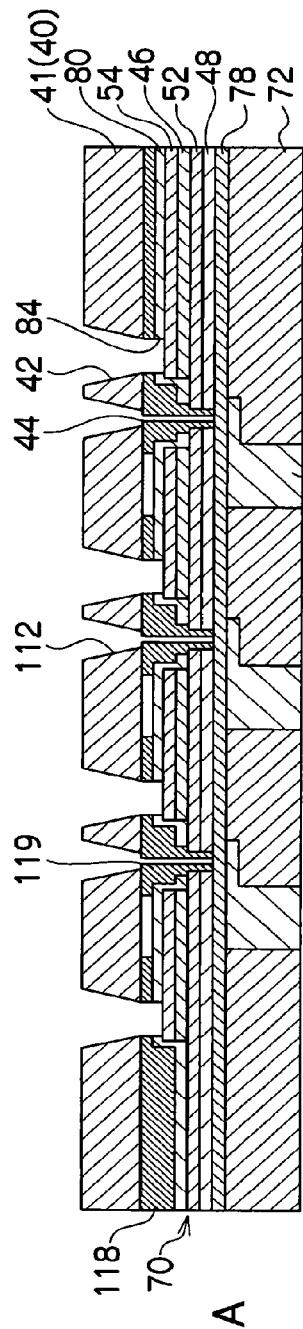
FIG. 15A to FIG. 15H are explanatory drawings showing process relating to a fourth exemplary embodiment of the present invention, after joining the ceiling plate member to the piezoelectric element substrate.
Figure 15B:
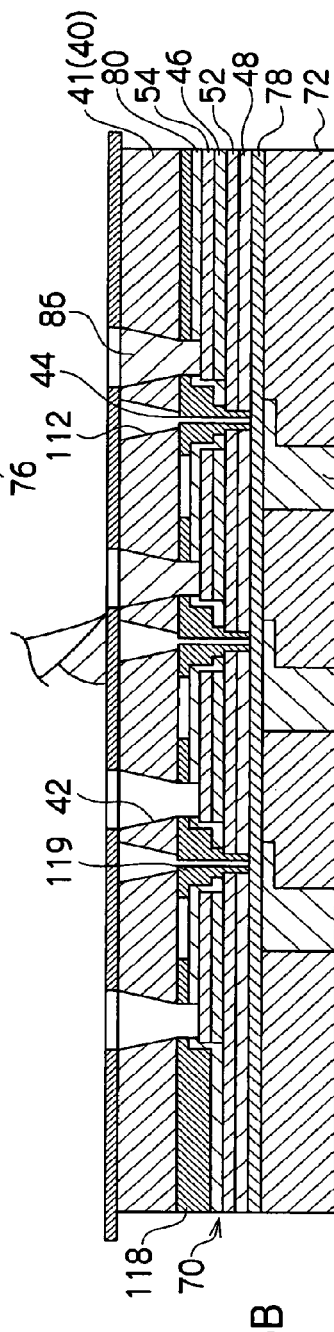

As shown in FIG. 15A, the ceiling plate 41 is placed on the piezoelectric element substrate 70, and when the both have been united (joined) by thermocompression bonding (e.g., 20 minutes at 350° C. and 2 kg/cm$^2$), as shown in FIG. 15B, the conductive paste 86 (e.g., a thermoplastic paste such as Dotite AE1650, Staystick 191, or the like, or a polyurethane paste such as Peltron K-3434 or the like, or a silver paste such as Dotite XA-410S-10 or the like) is filled (buried) into the through-holes 42 for electrical connection by screen printing, and subjected to curing processing. Thereafter, the top surface (obverse) thereof is polished and planarized.

Figure 15C:
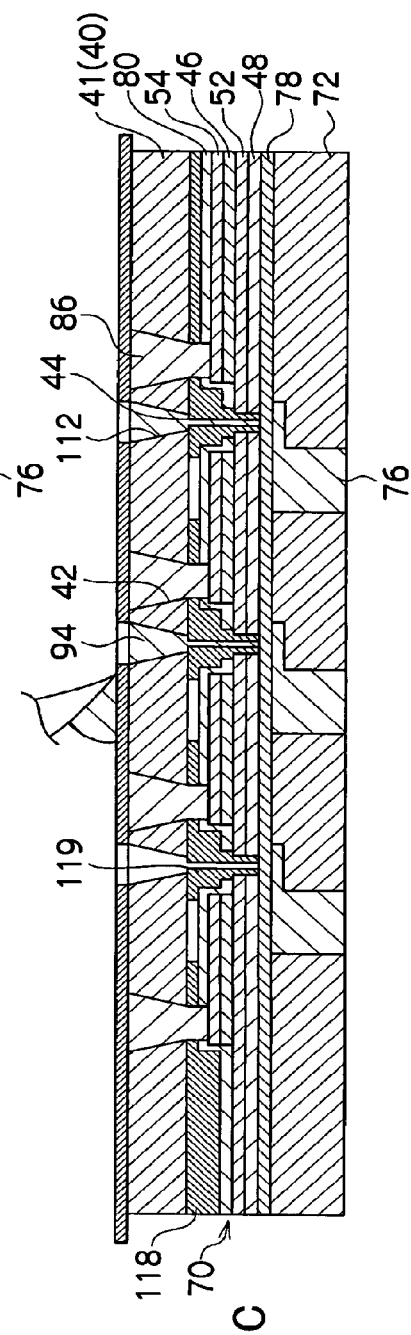

Next, in FIG. 15C, the positive photosensitive resin material 94 (e.g., PMGI, LOR, KMPR-1000 manufactured by Kayaku Microchem) serving as a sacrificial material is filled (buried) in the through-holes 112, 44 for ink supply by screen printing, and subjected to curing processing. Then, the top surface (obverse) thereof is polished and planarized. Note that the positive photosensitive resin material 94 may be filled by direct squeezing. In the case of direct squeezing, the positive photosensitive resin material 94 is selectively formed by photolithography.

Figure 15D:
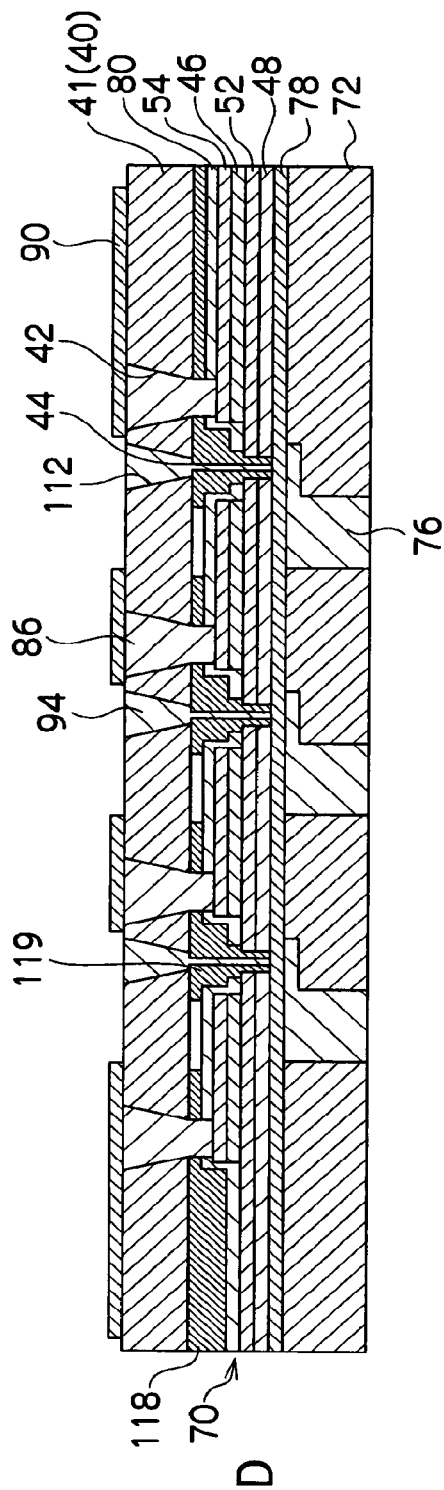

Then, as shown in FIG. 15D, the metal wires 90 are film-formed on the top surface of the ceiling plate 41 and patterned. Specifically, this is deposition of an Al film (thickness: 1 μm) by sputtering, resist formation by photolithography, wet etching of the Al film by using an $H_3PO_4$ chemical liquid, and resist removal by acetone (or oxygen plasma). Note that, at this time, the through-holes 42 for electrical connection are closed-up by the conductive paste 86, the through-holes 112, 44 for ink supply are closed-up by the positive photosensitive resin material 94, and the top surfaces (obverses) thereof are planarized. Therefore, the metal wires 90 can easily be formed (film-formed) by a spinning method.

Figure 15E:
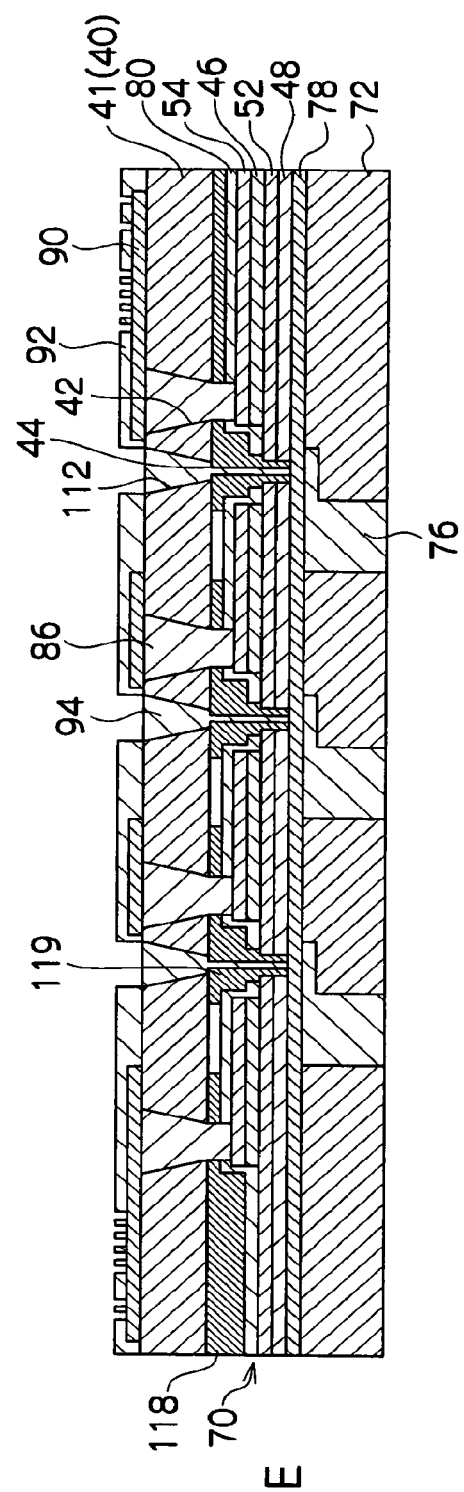

Then, as shown in FIG. 15E, the resin protective film 92 (e.g., photosensitive polyimide Durimide 7320 manufactured by FUJIFILM Electronics Materials Co., Ltd.) is layered on surfaces where the metal wires 90 are formed, and is patterned. Note that, at this time, the resin protective film 92 does not cover the through-holes 112 for ink supply (the first ink supply paths 114A). Further, in accordance with the above-described structure, the in-plane uniformity of the resin protective film 92 is good, and film formation can be controlled easily. Therefore, making the resin protective film 92 a thick film can be realized easily. Moreover, it suffices for an SiC film to be used as the resin protective film 92.

Figure 15F:
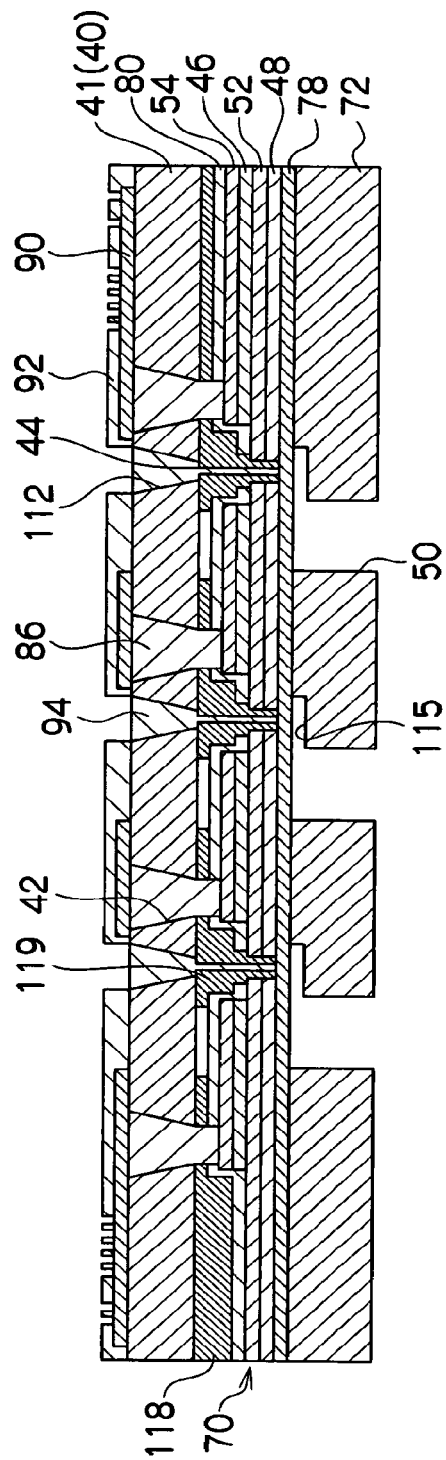
Figure 15G:
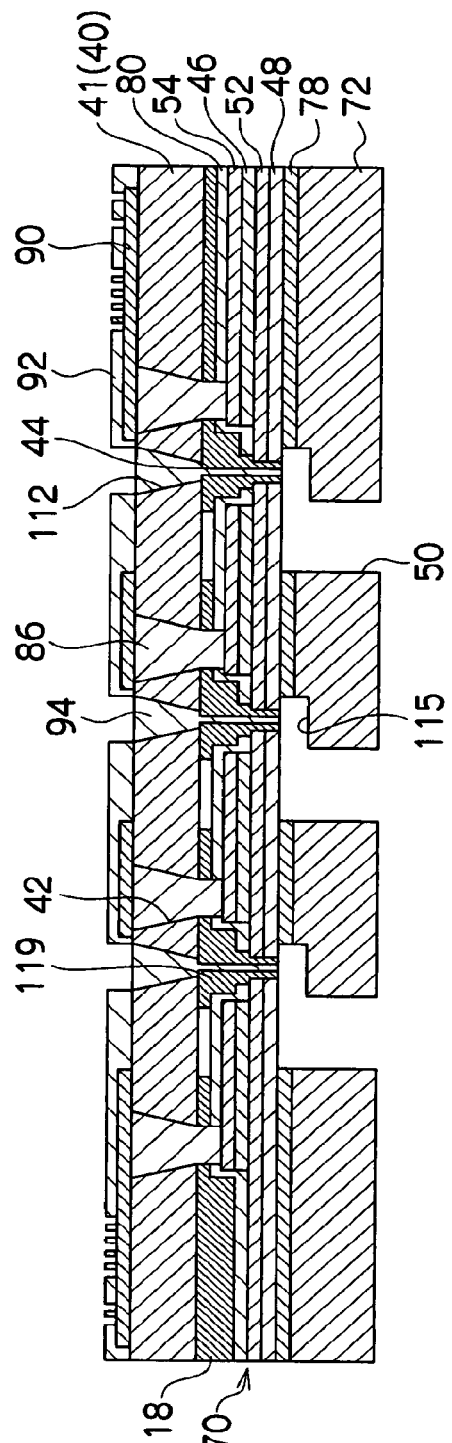

Next, as shown in FIG. 15F, the glass paste 76 which is filled (buried) in the silicon substrate 72 is selectively removed by etching by a dissolving solution containing HF. Thereafter, as shown in FIG. 15G, a dissolving solution of the Ge film 78, e.g., hydrogen peroxide ($H_2O_2$) which is heated to 60° C. for example, is supplied from the pressure chamber 115 side, and portions of the Ge film 78 are etched and removed. At this stage, the pressure chambers 115 and the connection paths 50 are completed.

Figure 15H:
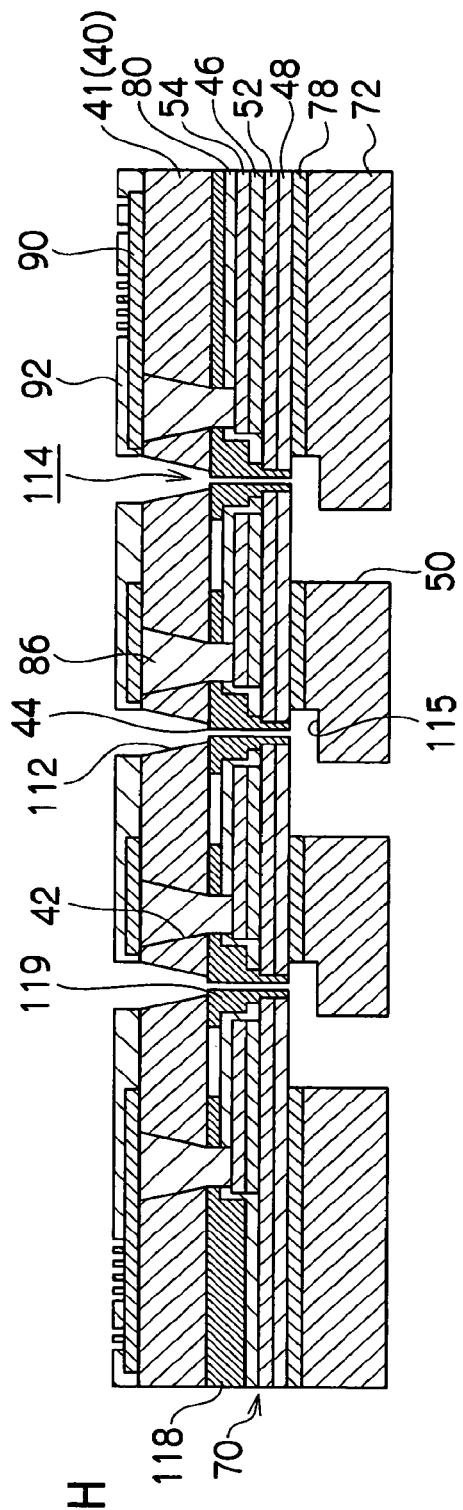

When the Ge film 78 has been etched in this way, as shown in FIG. 15H, the positive photosensitive resin material 94 within the through-holes 112 for ink supply is wet-etched and removed by a predetermined stripping liquid (a resist stripping liquid). Note that, at this time, because the metal wires 90 are covered and protected by the resin protective films 92, there is no fear that the metal wires 90 will be damaged. Further, because the conductive paste 86 as well is covered and protected by the resin protective films 92, there also is no fear that the conductive paste 86 will be removed by etching.

When the positive photosensitive resin material 94 within the through-holes 112 for ink supply has been removed by etching, curing processing of the resin protective film 92 is carried out. Note that, because the positive photosensitive resin material 94 can simply be removed by etching, there is the advantage that manufacturing is easy. Further, because processes thereafter are similar to those in the case of the above-described inkjet recording head 32 of the first exemplary embodiment, description thereof is omitted.

Fifth Exemplary Embodiment

The inkjet recording head 32 of a fifth exemplary embodiment will be described next. Note that, hereinafter, structural elements, members, and the like which are the same as those of the inkjet recording head 32 of the first exemplary embodiment are denoted by the same reference numerals, and detailed description thereof (including description of the operation) will be omitted. Further, only the method of manufacture (the manufacturing processes) of the inkjet recording head 32 of the fifth exemplary embodiment which differs from that of the inkjet recording head 32 of the first exemplary embodiment will be described on the basis of FIG. 16A to FIG. 16H. Namely, the processes, up to the manufacturing processes explained in FIG. 10A and FIG. 10B in the manufacturing processes of the inkjet recording head 32 of the first exemplary embodiment, are the same, and therefore, description of the manufacturing processes until then is omitted.

Figure 16A:
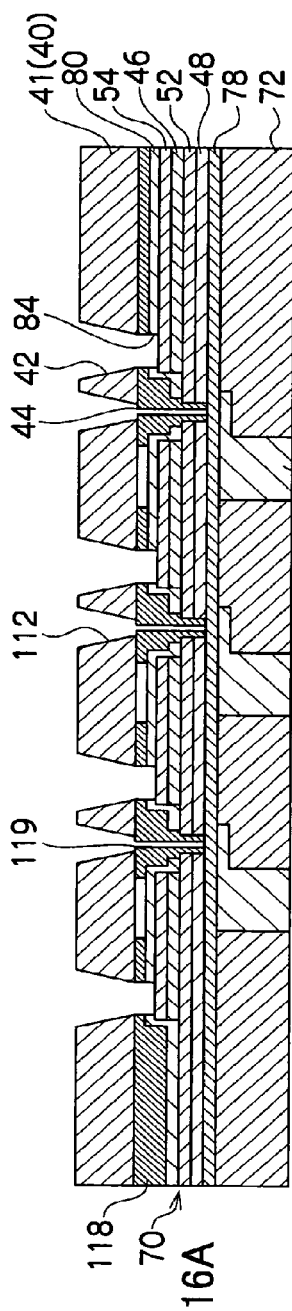
Figure 16B:
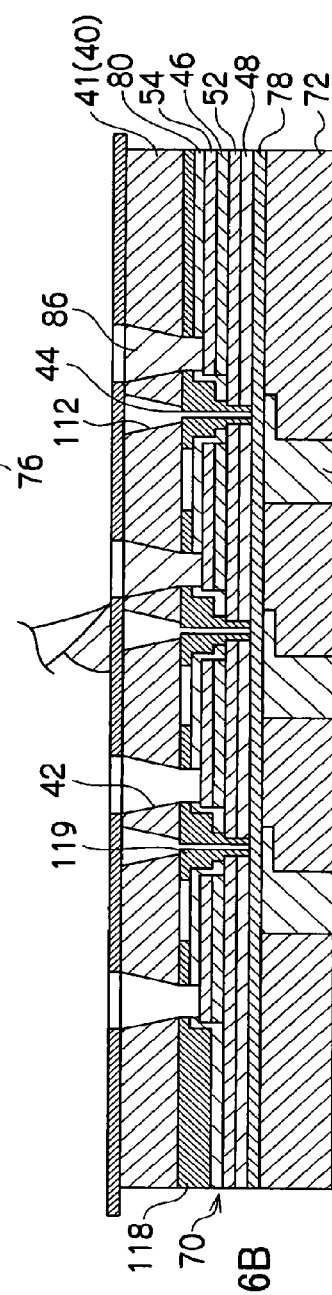

As shown in FIG. 16A, the ceiling plate 41 is placed on the piezoelectric element substrate 70, and when the both have been united (joined) by thermocompression bonding (e.g., 20 minutes at 350° C. and 2 kg/cm$^2$), as shown in FIG. 16B, the conductive paste 86 (e.g., a thermoplastic paste such as Dotite AE1650, Staystick 191, or the like, or a polyurethane paste such as Peltron K-3434 or the like, or a silver paste such as Dotite XA-410S-10 or the like) is filled (buried) in the through-holes 42 for electrical connection by screen printing, and subjected to curing processing. Then, the top surface (obverse) is polished and planarized.

Figure 16C:
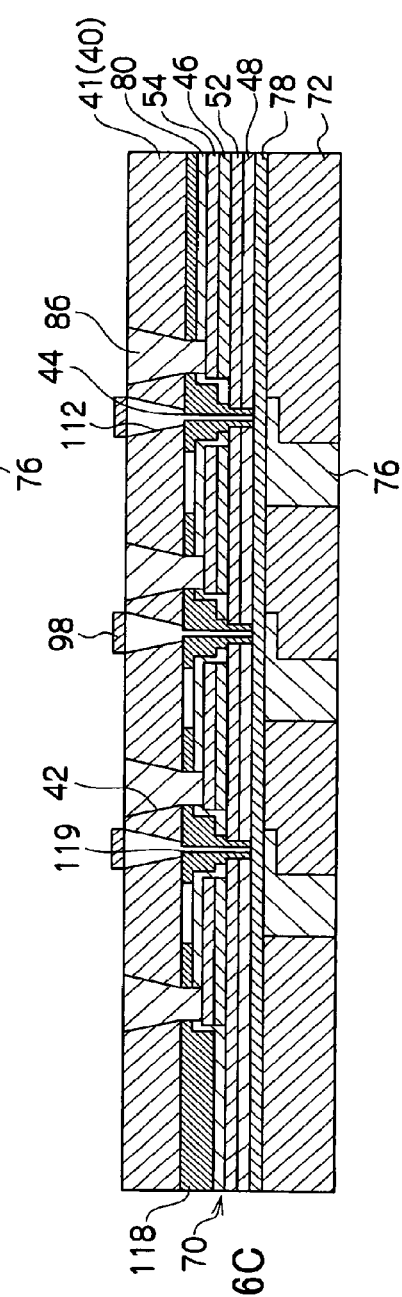

Next, as shown in FIG. 16C, a photosensitive dry film 98 (or a photosensitive polyimide dry film may be used) is affixed on the top surface of the ceiling plate 41, and is exposed, developed and cured, and the through-holes 112, 44 for ink supply are closed-up by the photosensitive dry film 98. Thereafter, as shown in FIG. 16D, the metal wires 90 are film-formed on the top surface of the ceiling plate 41 and patterned. Specifically, this is deposition of an Al film (thickness: 1 μm) by sputtering, resist formation by photolithography, wet etching of the Al film by using an $H_3PO_4$ chemical liquid, and resist removal by acetone (or oxygen plasma).

Note that, at this time, the through-holes 42 for electrical connection are closed-up by the conductive paste 86, and the top surfaces (obverses) thereof are planarized. Further, the through-holes 112, 44 for ink supply are closed-up by the photosensitive dry film 98. Therefore, the metal wires 90 can easily be formed (film-formed) by a spinning method.

Next, as shown in FIG. 16E, the resin protective film 92 (e.g., photosensitive polyimide Durimide 7320 manufactured by FUJIFILM Electronics Materials Co., Ltd.) is layered on surfaces where the metal wires 90 are formed, and is patterned. Note that, at this time, the resin protective film 92 does not cover the photosensitive dry film 98 which is closing-up the through-holes 112 for ink supply (the first ink supply paths 114A). Further, in accordance with the above-described structure, the in-plane uniformity of the resin protective film 92 is good, and film formation can be controlled easily. Therefore, making the resin protective film 92 a thick film can be realized easily. Moreover, it suffices for an SiC film to be used as the resin protective film 92.

Figure 16F:
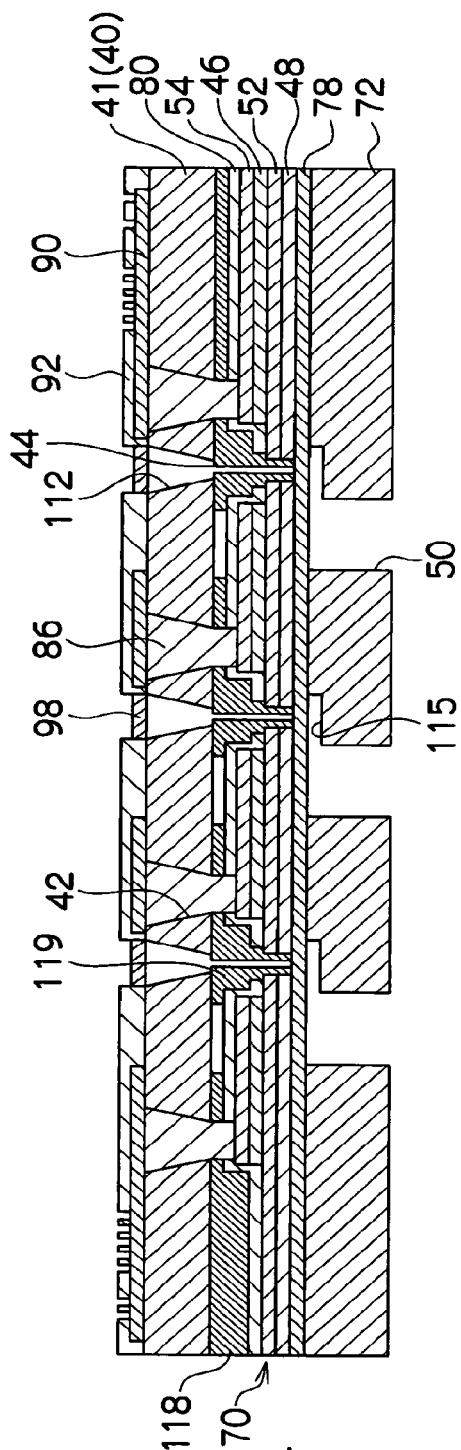
Figure 16G:
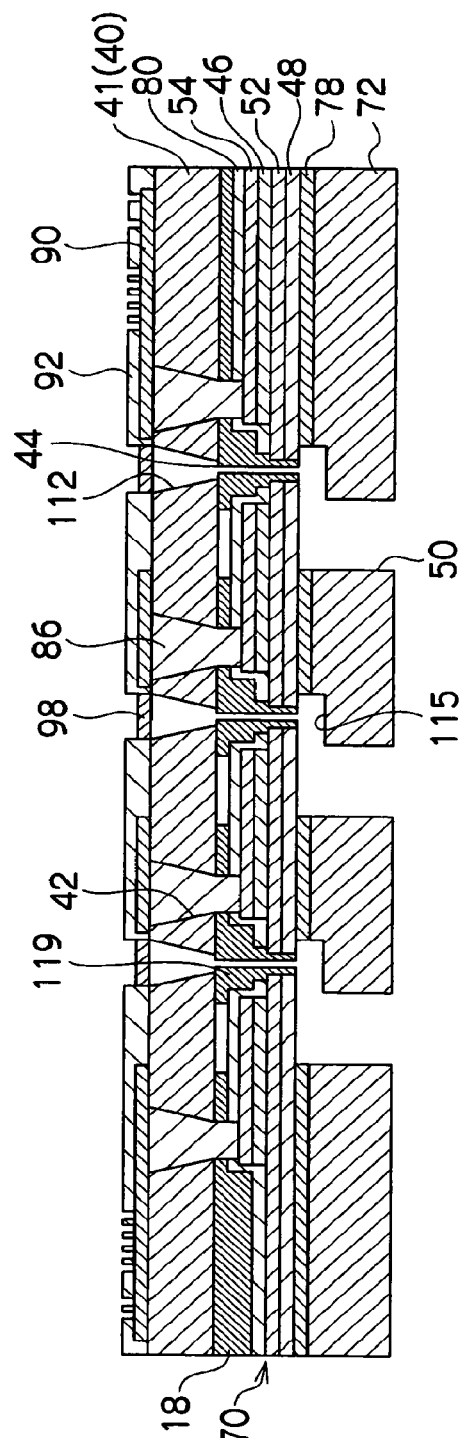

Then, as shown in FIG. 16F, the glass paste 76 which is filled (buried) in the silicon substrate 72 is selectively removed by etching by a dissolving solution containing HF. Thereafter, as shown in FIG. 16G, a dissolving solution of the Ge film 78, e.g., hydrogen peroxide ($H_2O_2$) which is heated to 60° C. for example, is supplied from the pressure chamber 115 side, and portions of the Ge film 78 are etched and removed. At this stage, the pressure chambers 115 and the connection paths 50 are completed.

When the Ge film 78 has been removed by etching in this way, as shown in FIG. 16H, the photosensitive dry film 98 which is closing-up the through-holes 112, 44 for ink supply is removed by a predetermined stripping liquid (a sodium hydroxide aqueous solution) or by dry etching. Note that, at this time, because the metal wires 90 are covered and protected by the resin protective films 92, there is no fear that the metal wires 90 will be damaged. Further, because the conductive paste 86 as well is covered and protected by the resin protective films 92, there also is no fear that the conductive paste 86 will be removed.

When the photosensitive dry film 98, which had been closing-up the through-holes 112, 44 for ink supply, has been stripped (removed), curing processing of the resin protective film 92 is carried out. Note that, because the through-holes 112, 44 for ink supply can be opened merely by removing the photosensitive dry film 98 which closed-up the through-holes 112, 44 for ink supply, there is the advantage that the inkjet recording head 32 can be manufactured even easier than a case in which the a filling material is filled and removed as in the first through fourth exemplary embodiments. Further, because processes thereafter are similar to those in the case of the above-described inkjet recording head 32 of the first exemplary embodiment, description thereof is omitted.

Sixth Exemplary Embodiment

Figure 17A:
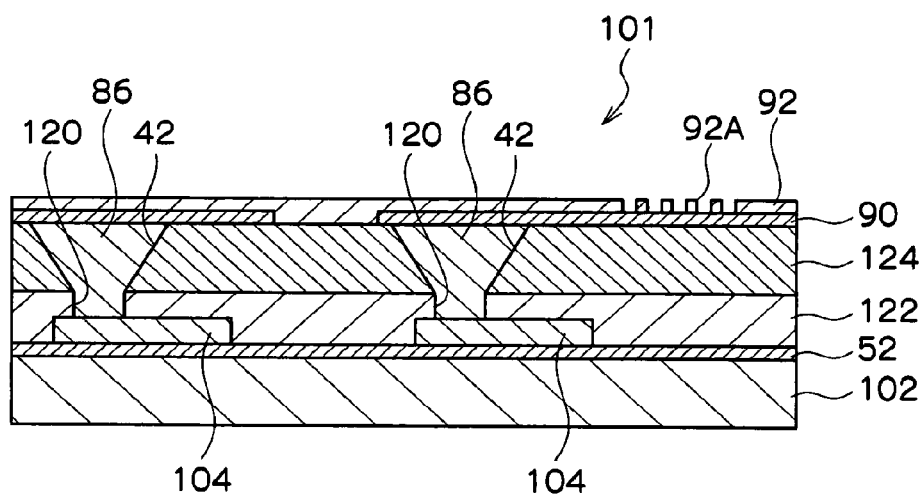
FIG. 17A and FIG. 17B are explanatory drawings showing circuit substrates relating to a sixth exemplary embodiment of the present invention.
Figure 17B:
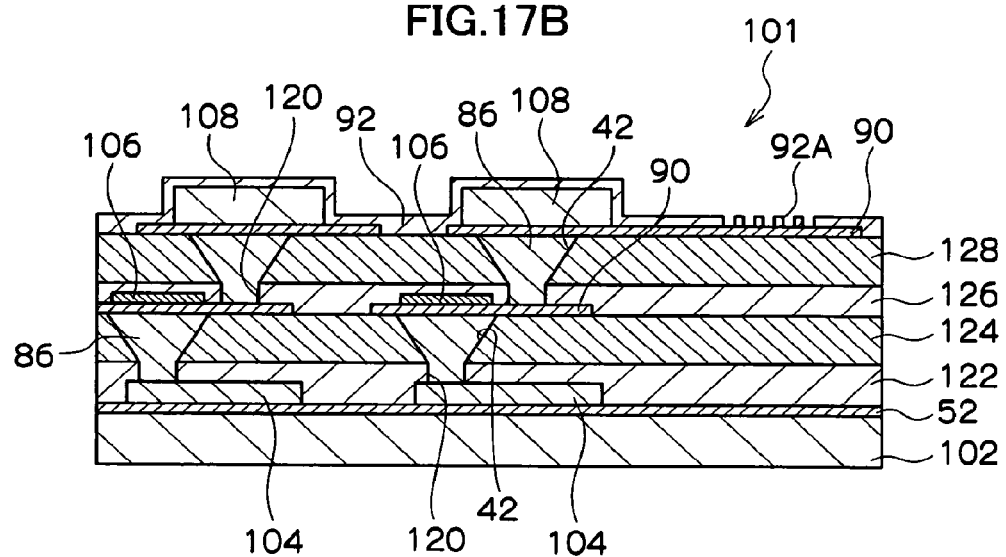

Finally, a sixth exemplary embodiment, which applies the present invention to the general circuit substrate 101, will be described on the basis of FIG. 17A and FIG. 17B. Note that structural elements, members, and the like which are the same as those of the inkjet recording heads 32 of the first through fifth exemplary embodiments are denoted by the same reference numerals, and detailed description thereof (including description of the operation) will be omitted. As shown in FIG. 17A and FIG. 17B, at the circuit substrate 101 as well, devices 104, such as memories, ICs, capacitors, transistors, or the like, are connected to the metal wires 90 by the conductive paste 86. Hereinafter, methods of manufacturing (i.e., the manufacturing processes of) the circuit substrates 101 shown in FIG. 17A and FIG. 17B will be described simply.

First, at the circuit substrate 101 shown in FIG. 17A, the lower electrode 52 is film-formed on a supporting substrate 102, and the devices 104 are formed thereon. A resin layer 122 having the through-holes 120 is formed on the devices 104, and a ceiling plate 124, which has the through-holes 42 for electric connection, is united (joined) to the top surface thereof. Then, after the conductive paste 86 is filled into the through-holes 42 for electrical connection and the through-holes 120, the top surface (obverse) of the ceiling plate 124 is polished and planarized. Thereafter, the metal wires 90 are formed (film-formed) on the top surface of the ceiling plate 124, the resin protective film 92 is film-formed on the metal wires 90, and an electrical connection portion 92A is patterned.

Next, to describe the circuit substrate 101 shown in FIG. 17B, devices 104, 106, 108 are formed at respective layers of this circuit substrate 101. Namely, the lower electrode 52 is film-formed on the supporting substrate 102, and the devices 104 are formed thereon. The resin layer 122 having the through-holes 120 is formed on the devices 104, and the ceiling plate 124, which has the through-holes 42 for electric connection, is united (joined) to the top surface thereof. Then, after the conductive paste 86 is filled into the through-holes 42 for electrical connection and the through-holes 120, the top surface (obverse) of the ceiling plate 124 is polished and planarized. Thereafter, the metal wires 90 are formed (film-formed) on the top surface of the ceiling plate 124.

The devices 106 are formed on the metal wires 90, a resin layer 126 having the through-holes 120 is formed on the devices 106, and a ceiling plate 128, which has the through-holes 42 for electric connection, is united (joined) to the top surface thereof. Then, after the conductive paste 86 is filled into the through-holes 42 for electrical connection and the through-holes 120, the top surface (obverse) of the ceiling plate 128 is polished and planarized. Thereafter, the metal wires 90 are formed (film-formed) on the top surface of the ceiling plate 128. The devices 108 are formed on the metal wires 90, the resin protective film 92 is film-formed on the devices 108 and the metal wires 90, and the electrical connection portion 92A is patterned.

Also in the circuit substrates 101 which are structured in this way, the surface is polished and planarized after the conductive paste 86 (e.g., a thermoplastic paste such as Dotite AE1650, Staystick 191, or the like, or a polyurethane paste such as Peltron K-3434 or the like, or a silver paste such as Dotite XA-410S-10 or the like) is filled in the through-holes 42 for electrical connection. Therefore, the high-density metal wires 90 can be easily film-formed (formed) on the surface thereof. Further, in the film-forming (forming) of the resin protective film 92 as well, because the in-plane uniformity is good and film formation can be controlled easily, making the resin protective film 92 a thick film can be realized easily. Accordingly, the three-dimensional, high-density circuit substrate 101 can be formed easily, and a device which packages the circuit substrate 101 can be made compact.

As described above, the metal wires 90 are formed after the filling material (the conductive paste 86, the negative photosensitive resin material 88, or the positive photosensitive resin material 94) is filled in the through-holes 42 for electrical connection and the through-holes 112, 42 for ink supply and the surface thereof is planarized. Therefore, the high-density metal wires 90 can be easily formed (film-formed). Further, in the forming (film-forming) of the resin protective film 92 and the like as well, in-plane uniformity of the film thickness is obtained easily and well, and a thick film can be realized easily. Therefore, produceability can be prevented from deteriorating.

The inkjet recording heads 32, which eject ink drops of the respective colors of yellow (Y), magenta (M), cyan (C), and black (K), are given as an example of the liquid drop ejecting head relating to the present invention. The inkjet recording device 10, which is equipped with the inkjet recording heads 32, is given as an example of the liquid drop ejecting device. However, the liquid drop ejecting head and the liquid drop ejecting device relating to the present invention are not limited to the recording of images (including characters) onto the recording sheets P.

Namely, in the inkjet recording devices 10 of the above-described exemplary embodiments, ink drops are ejected, selectively on the basis of image data, from the inkjet recording heads 32 of the inkjet recording units 30, and a full-color image is recorded on the recording sheet P. However, the recording medium is not limited to the recording sheet P, and further, the liquid which is ejected is not limited to the ink 110.

For example, the inkjet recording head 32 relating to the present invention can be applied to liquid drop jetting devices in general which are used industrially, such as in fabricating color filters for displays by ejecting the ink 110 onto a high polymer film or glass, or in forming bumps for parts packaging by ejecting solder in a welded state onto a substrate, or the like.

What is claimed is:

1. A substrate having a plurality of through-holes, comprising:
   a wiring pattern, wherein
   the substrate is manufactured by the wiring pattern being formed on the substrate after a filling material is buried in the through-holes and a surface of the substrate is planarized,
   the filling material is a conductive material, and
   a portion of the conductive material is removed after the wiring pattern is formed.

2. A substrate having a plurality of through-holes, comprising:
   a wiring pattern, wherein
   the substrate is manufactured by burying a conductive material in some of the through-holes, planarizing a surface of the substrate, closing-up remaining through-holes with a film, and thereafter, forming the wiring pattern on the substrate, and removing the film.

* * * * *